United States Patent
Zhong et al.

(10) Patent No.: US 10,886,126 B2
(45) Date of Patent: Jan. 5, 2021

(54) UNIFORM MULTILAYER GRAPHENE BY CHEMICAL VAPOR DEPOSITION

(75) Inventors: Zhaohui Zhong, Ann Arbor, MI (US); Seunghyun Lee, Ann Arbor, MI (US); Kyunghoon Lee, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 1780 days.

(21) Appl. No.: 13/225,135

(22) Filed: Sep. 2, 2011

(65) Prior Publication Data

US 2012/0225296 A1 Sep. 6, 2012

Related U.S. Application Data

(60) Provisional application No. 61/379,925, filed on Sep. 3, 2010.

(51) Int. Cl.
*B32B 9/00* (2006.01)
*H01L 21/02* (2006.01)
(Continued)

(52) U.S. Cl.
CPC .......... *H01L 21/0262* (2013.01); *B82Y 30/00* (2013.01); *B82Y 40/00* (2013.01);
(Continued)

(58) Field of Classification Search
CPC .............. Y10T 428/30; C01B 31/0438; C01B 2204/00; C23C 16/00; C23C 16/26; B82Y 30/00
(Continued)

(56) References Cited

U.S. PATENT DOCUMENTS

2009/0047520 A1 2/2009 Lee et al.
2010/0021708 A1* 1/2010 Kong et al. ................... 428/220
(Continued)

FOREIGN PATENT DOCUMENTS

JP 2008050228 3/2008

OTHER PUBLICATIONS

Large scale pattern growth of graphene films for stretchable transparent electrodes, Kim, nature vol. 457 Feb. 5, 2009.*
(Continued)

*Primary Examiner* — Daniel H Miller
(74) *Attorney, Agent, or Firm* — Reising Ethington P.C.

(57) ABSTRACT

A method of producing uniform multilayer graphene by chemical vapor deposition (CVD) is provided. The method is limited in size only by CVD reaction chamber size and is scalable to produce multilayer graphene films on a wafer scale that have the same number of layers of graphene throughout substantially the entire film. Uniform bilayer graphene may be produced using a method that does not require assembly of independently produced single layer graphene. The method includes a CVD process wherein a reaction gas is flowed in the chamber at a relatively low pressure compared to conventional processes and the temperature in the reaction chamber is thereafter decreased relatively slowly compared to conventional processes. One application for uniform multilayer graphene is transparent conductors. In processes that require multiple transfers of single layer graphene to achieve multilayer graphene structures, the disclosed method can reduce the number of process steps by at least half.

28 Claims, 32 Drawing Sheets

(51) Int. Cl.
　　　C23C 16/26　　(2006.01)
　　　C23C 16/455　(2006.01)
　　　B82Y 40/00　　(2011.01)
　　　C23C 16/02　　(2006.01)
　　　B82Y 30/00　　(2011.01)
　　　C01B 32/184　(2017.01)
　　　C01B 32/186　(2017.01)

(52) U.S. Cl.
　　　CPC .......... *C01B 32/184* (2017.08); *C01B 32/186* (2017.08); *C23C 16/0209* (2013.01); *C23C 16/26* (2013.01); *C23C 16/45502* (2013.01); *C23C 16/45557* (2013.01); *H01L 21/02381* (2013.01); *H01L 21/02425* (2013.01); *H01L 21/02488* (2013.01); *H01L 21/02527* (2013.01); *C01B 2204/32* (2013.01); *Y10T 428/30* (2015.01)

(58) Field of Classification Search
　　　USPC .............................. 428/408; 423/447.1, 448
　　　See application file for complete search history.

(56)　　　　　　　References Cited

U.S. PATENT DOCUMENTS

2011/0030772 A1*　2/2011　Veerasamy ............ B82Y 30/00
　　　　　　　　　　　　　　　　　　　　　　　　　136/256
2012/0161098 A1*　6/2012　Hiura et al. ...................... 257/9

OTHER PUBLICATIONS

A.K. Geim et al., "The Rise of Graphene," Nature Materials, vol. 6, 2007, pp. 1-9.
A.H. Castro Neto et al., "The Electronic Properties of Graphene," Reviews of Modern Physics, vol. 81, Jan.-Mar. 2009, pp. 1-54.
A.K.Geim et al., "Graphene: Status and Prospects," Science 324,1530, 2009, pp. 1-6.
Schwierz, Frank, "Graphene Transistors," Nature Nanotechnology, May 2010, pp. 1-10.
Y.M. Lin et al., "100-Ghz Transistors from Wafer-Scale Epitaxial Graphene," Science, vol. 327, 2010, p. 662.
Melinda Y. Han., "Energy Band-Gap Engineering of Graphene Nanoribbons," Physical Review Letters, The American Physical Society, 2007, PRL 98, 206805, pp. 1-4.
Zhihong Chen et al.,. "Graphene Nano-Ribbon Electronics," Physica E 2007, 40, pp. 1-5.
Xiaolin Li et al., "Chemically Derived, Ultrasmooth Graphene Nanoribbon Semiconductors," Science 319, 1229, 2008, pp. 1-5.
S.Y.Zhou et al., "Substrate-Induced Bandgap Opening in Epitaxial Graphene," Nature Materials, vol. 6, 2007, pp. 1-7.
Taisuke Ohta et al., "Controlling the Electronic Structure of Bilayer Graphene," Science 313, 2006, pp. 1-5.
Edward McCann, "Asymmetry Gap in the Electronic Band Structure of Bilayer Graphene," Physical Review B 74, 161403, 2006, pp. 1-4.
Eduardo Castro et al., "Biased Bilayer Graphene: Semiconductor with a Gap Tunable by the Electric Field Effect," Physical Review Letters, The American Physical Society, PRL 99, 216802, 2007, pp. 1-4.
Jeroen B. Oostinga et al., "Gate-Induced Insulating State in Bilayer Graphene Devices," Nature Materials, vol. 7, 2008, pp. 1-7.
Yuanbo Zhang et al., "Direct Observation of a Widely Tunable Bandgap in Bilayer Graphene," Nature, vol. 459, 2009, pp. 1-4.
Kin Fai Mak et al., "Observation of an Electric-Field-Induced Band Gap in Bilayer Graphene by Infrared Spectroscopy," Physical Review Letters, The American Physical Society, PRL 102, 256405, 2009, pp. 1-4.
Fengnian Xia et al., "Graphene Field-Effect Transistors with High On/Off Current Ratio and Large Transport Band Gap at Room Temperature," Nano Letters, 2010, 10, pp. 1-4.
Cheol-Hwan Park et al., "Tunable Excitons in Biased Bilayer Graphene," Nano Letters, 2010, 10, pp. 1-6.
Peter W. Sutter et al. "Epitaxial Graphene on Ruthenium," Nature Materials, vol. 7, 2008, pp. 1-6.
Johann Coraux et al., "Structural Coherency of Graphene on Ir(111)," Nano Letters, vol. 8, No. 2, 2008, pp. 1-6.
Keun Soo Kim et al., "Large-Scale Pattern Growth of Graphene Films for Stretchable Transparent Electrodes," Nature, vol. 457, 2009, pp. 1-5.
Youngbin Lee et al., "Wafer-Scale Synthesis and Transfer of Graphene Films," Nano Letters 2010, 10, pp. 1-4.
Alfonso Reina et al., "Large Area, Few-Layer Graphene Films on Arbitrary Substrates by Chemical Vapor Deposition," Nano Letters, vol. 9, No. 1, 2009, pp. 1-6.
Xuesong Li et al., "Large-Area Synthesis of High-Quality and Uniform Graphene Films on Copper Foils," Science 324, 1312, 2009, pp. 1-4.
Stephane Berciaud et al., "Probing the Intrinsic Properties of Exfoliated Graphene: Raman Spectroscopy of Free-Standing Monolayers," Nano Letters, vol. 9, No. 1, 2009, pp. 1-7.
L.M. Malard et al., "Raman Spectroscopy in Graphene," Physics Reports, 2009, 473, pp. 1-37.
A.C. Ferrari et al., "Raman Spectrum of Graphene and Graphene Layers," Physical Review Letters, The American Physical Society, PRL 97,187401, pp. 1-4.
M.F. Craciun et al., "Trilayer Graphene is a Semimetal with a Gate-Tunable Band Overlap, "Nature Nanotechnology, vol. 4, 2009, pp. 1-6.
Joshua D. Caldwell et al., "Technique for the Dry Transfer of Epitaxial Graphene onto Arbitrary Substrates," ACS Nano, vol. 4, No. 2, 2010, pp. 1-7.
Paul Preuss, "Bilayer Graphene Gets a Bandgap" Lawrence Berkeley National Laboratory, Back to EurekAlert!, Berkeley, California, Aug. 25, 2010, pp. 1-3.
Sukang Bae et al., "Roll-to-Roll Production of 30-Inch Graphene Films for Transparent Electrodes," Letters, Nature Nanotechnology, vol. 5, Aug. 2010, pp. 1-5.
Wang, Xianbao, et al. Large-Scale Synthesis of Few-Layered Graphene Using CVD, 4 pages.
International Search Report for PCT/US2011/050396, dated Apr. 9, 2012, 3 pages.

* cited by examiner

UNIFORM MULTILAYER GRAPHENE BY CHEMICAL VAPOR DEPOSITION

CROSS-REFERENCE TO RELATED APPLICATION

This application claims the benefit of U.S. Provisional Patent Application No. 61/379,925, filed Sep. 3, 2010, the complete disclosure of which is hereby incorporated by reference.

TECHNICAL FIELD

This invention relates generally to elemental carbon compositions and, more particularly, to graphene, methods of producing graphene, and products having graphene.

BACKGROUND OF THE INVENTION

Single and few-layer graphene has emerged as a promising material for novel applications in electronics due to certain advantageous optical and electrical properties and due to its potential for integrating bottom-up nanomaterial synthesis with top-down lithographic fabrication at a wafer size or macro scale. Its semi-metallic nature with high carrier mobility and low opacity also makes it a good candidate for use as transparent conductors for photovoltaic devices, touch panels, and displays, for example. Graphene structures also have high chemical resistance, low manufacturing costs, and, being atomically thin, are relatively flexible when compared to some other transparent conductor materials such as indium tin oxide (ITO). Bilayer graphene (BLG) in particular holds further promise for use in post-silicon electronics applications because a bandgap up to 250 meV can be induced in the material using an electric field, which is not possible with single or monolayer graphene (SLG), and because exciton binding energies in BLG are tunable by electric field-induced bandgap.

A monolayer or single layer graphene is a plane of carbon atoms bonded in a hexagonal array. Several methods have been used to synthesize graphene films including the reduction of graphene oxide, liquid exfoliation using organic solvents, and chemical vapor deposition (CVD). The CVD method has drawn much attention, as this method can yield high quality graphene films. Homogeneous single layer graphene has been synthesized on transition metal substrates, such as copper, that have low carbon solubility using low pressure CVD (LPCVD). But the sheet resistance of pristine or undoped SLG is on the order of 2000-6000Ω— too large to for use as a transparent conductor, for example. Stacking multiple individually produced layers of SLG and individually doping each layer is one method that has been used to achieve lower film resistance for graphene structures. But fabrication of a multi-sheet SLG stack can require a multitude of transfer processes, depending on the number of SLG sheets desired in the stack. This can lead to high processing time and cost, and a higher likelihood of defects in the films.

Bilayer graphene has been fabricated by initially producing two separate monolayers of graphene and subsequently using a sacrificial carrier to physically stack one of the separate monolayers on the other. BLG has also been fabricated via mechanical exfoliation of graphite to produce SLG that is subsequently stacked with another SLG, but the sheet size is limited to the square-micron range and such processes are not scalable to sizes large enough to be practical for use in many electronics applications. The synthesis of wafer scale uniform bilayer graphene product presents a tremendous challenge.

Graphene sheets having multiple layers of graphene with lower sheet resistance than SLG have been directly synthesized using an LPCVD method on other transition metals, such as nickel, that have relatively high carbon solubility and on copper using atmospheric pressure CVD (APCVD). Multiple layer graphene (MLG) structures produced by these methods typically have non-uniform thickness, with different numbers of graphene layers throughout the structure, and rough surfaces compared to LPCVD-grown SLG. Graphene sheet thickness variation can be problematic for use in electronics applications because it causes the sheet resistance and optical transmittance to vary among different areas of the sheet. Additionally, APCVD processes that are used to produce MLG can lead to higher numbers of defects compared to LPCVD SLG due to particulate deposition resulting from APCVD conditions.

SUMMARY OF THE INVENTION

In accordance with one embodiment, a method of directly synthesizing uniform multilayer graphene by chemical vapor deposition is provided.

In accordance with another embodiment, a method of producing multilayer graphene is provided. The method comprises the steps of: (a) placing a substrate having a metal surface in a reaction chamber of a furnace; (b) flowing $H_2$ gas in the reaction chamber; (c) increasing the temperature in the reaction chamber to a desired level; (d) after the temperature in the reaction chamber reaches the desired level, ceasing flow of the $H_2$ gas, and flowing reaction gas in the reaction chamber for a desired time; and (e) after the desired time, decreasing the temperature in the reaction chamber at a controlled rate.

In accordance with another embodiment, a method of producing multilayer graphene is provided. The method comprises the steps of: (a) placing a substrate having a metal surface in a reaction chamber of a furnace; (b) evacuating the reaction chamber; (c) purging the reaction chamber with a working gas; (d) flowing $H_2$ gas in the reaction chamber; (e) increasing the temperature in the reaction chamber to a desired level; (f) after the temperature in the reaction chamber reaches the desired level, ceasing flow of the $H_2$ gas so that the reaction chamber is free of $H_2$ gas, and flowing reaction gas in the reaction chamber at a pressure in the reaction chamber of less than 0.5 Torr; and (g) thereafter decreasing the temperature in the reaction chamber at a rate of less than 100° C./min.

In accordance with another embodiment, a method of making a multilayer graphene film is provided. The method comprises the steps of: (a) synthesizing uniform multilayer graphene by chemical vapor deposition; (b) providing a uniform graphene sheet having at least one layer of graphene; and (c) stacking the uniform multilayer graphene of step (a) together with the uniform graphene sheet of step (b).

In accordance with another embodiment, a multilayer graphene film is provided. The film has interlayer uniformity and also has the same number of graphene layers throughout a major portion of the sheet.

BRIEF DESCRIPTION OF THE DRAWINGS

Preferred exemplary embodiments of the invention will hereinafter be described in conjunction with the appended drawings, wherein like designations denote like elements, and wherein.

DETAILED DESCRIPTION OF THE ILLUSTRATED EMBODIMENTS

Figure 1A:
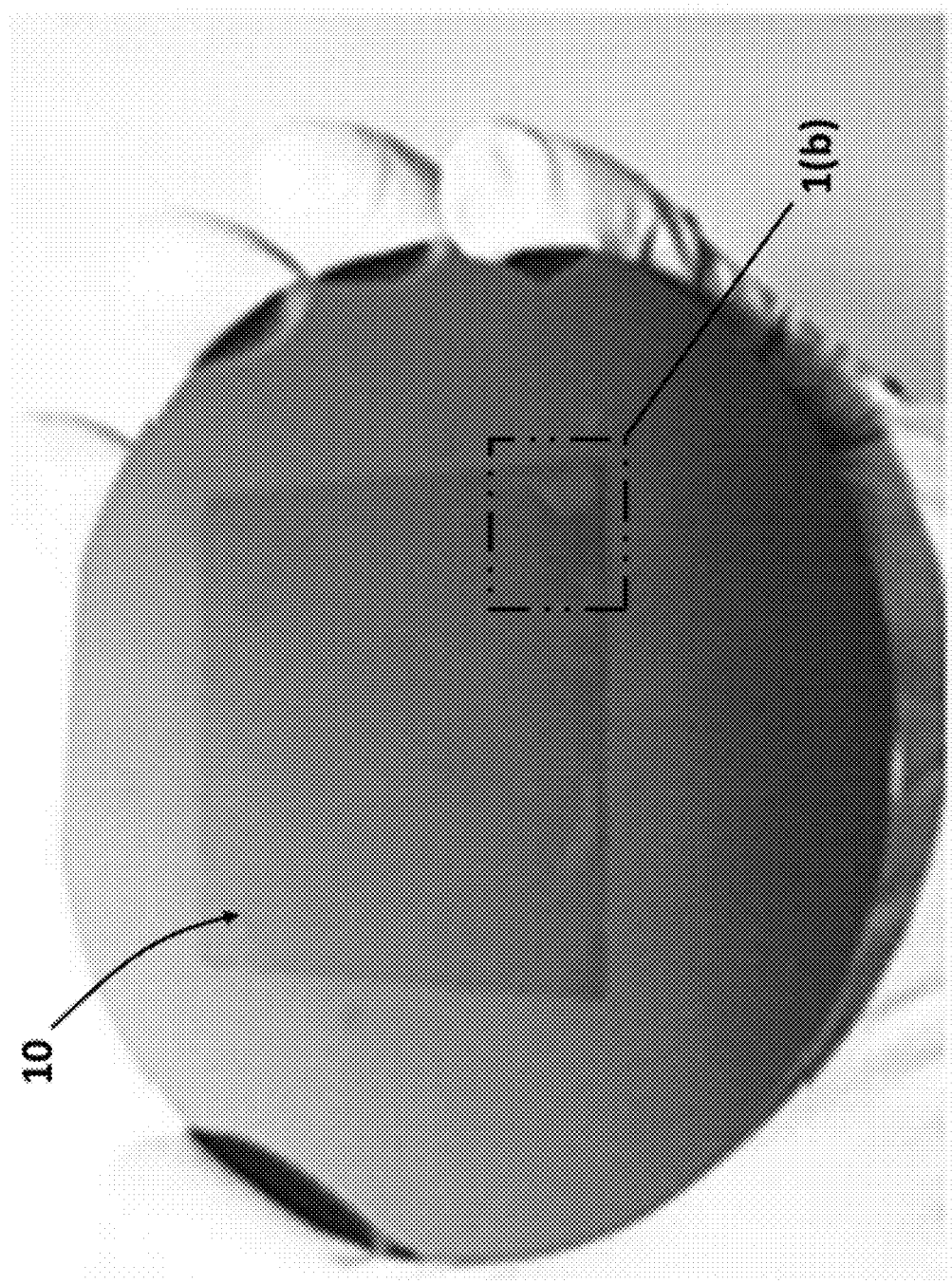
FIG. 1(a) shows a 2-inch×2-inch sheet of uniform bilayer graphene grown by chemical vapor deposition (CVD) and transferred onto a 4-inch silicon substrate with 280 nm thermal oxide.

Described below are exemplary embodiments of a method of producing uniform multilayer graphene by chemical vapor deposition (CVD), as well as exemplary graphene structures and products that may be constructed using the method. Uniform multilayer graphene may be directly synthesized or grown on a CVD substrate in a CVD reaction chamber. As such, the multiple graphene layers may be deposited in a single CVD process or process cycle without the need to produce multiple separate monolayers and then stack the monolayers on top of one another. Uniform bilayer graphene (BLG) can be produced using one embodiment of the method. Multilayer graphene produced as described herein may be further characterized by interlayer uniformity due to the nature of CVD processes and the manner in which the individual carbon atoms self-organize in such a process. Certain embodiments of the method may be expanded to include fabrication of flexible transparent conductors from CVD-produced multilayer graphene films on a macro scale. In one example, a plurality of uniform bilayer graphene sheets may be stacked together, thus significantly reducing manufacturing costs, time, and interlayer defects.

As used herein, the term "uniform," when used to characterize a graphene structure having multiple layers, refers to the consistency throughout the structure with respect to the number of graphene layers. A uniform multilayer graphene structure is characterized by significant and continuous portions of the structure having the same number of graphene layers. A uniform multilayer graphene structure may also be described as having a major portion that includes the same number of graphene layers. A major portion may be 50% or more.

The term "layer" where used to describe graphene structures will be used to denote a single, atom-thick layer. Thus, bilayer graphene refers to a structure with two layers of graphene, one overlying the other, and multilayer graphene broadly refers to a graphene structure having two or more graphene layers.

The terms "sheet" or "film" when used herein to describe a graphene structure refers to a graphene structure having any number of graphene layers, from a single layer to two or more layers. These terms do not imply any particular dimensions, other than the generally dimensional relationships inherent with graphene, where in-plane dimensions of graphene are significantly larger than atomic-scale graphene thickness dimensions.

The term "interlayer uniformity," as used herein to describe multilayer graphene, refers to the positional organization of the hexagonal array of carbon atoms in one layer of graphene with respect to the hexagonal array(s) of carbon atoms in other layers of the multilayer graphene structure. For example, where a layer of graphene is arranged in a horizontal plane, an adjacent overlying layer may be positioned so that the carbon atoms of the two layers are vertically aligned with each other (i.e., A-A stacking) or so that the carbon atoms of one layer are vertically aligned with the centers of the hexagonal carbon rings of the adjacent layer (i.e., A-B or Bernal stacking) These arrangements of carbon atoms among various layers of graphene structures are characterized by interlayer uniformity.

The term or prefix "macro" where used herein to characterize physical dimensions of graphene structure refers to dimensions generally larger than microscopic. Dimensions larger than about 500 μm or 0.5 mm may be considered to be on the macro scale.

Figure 5:
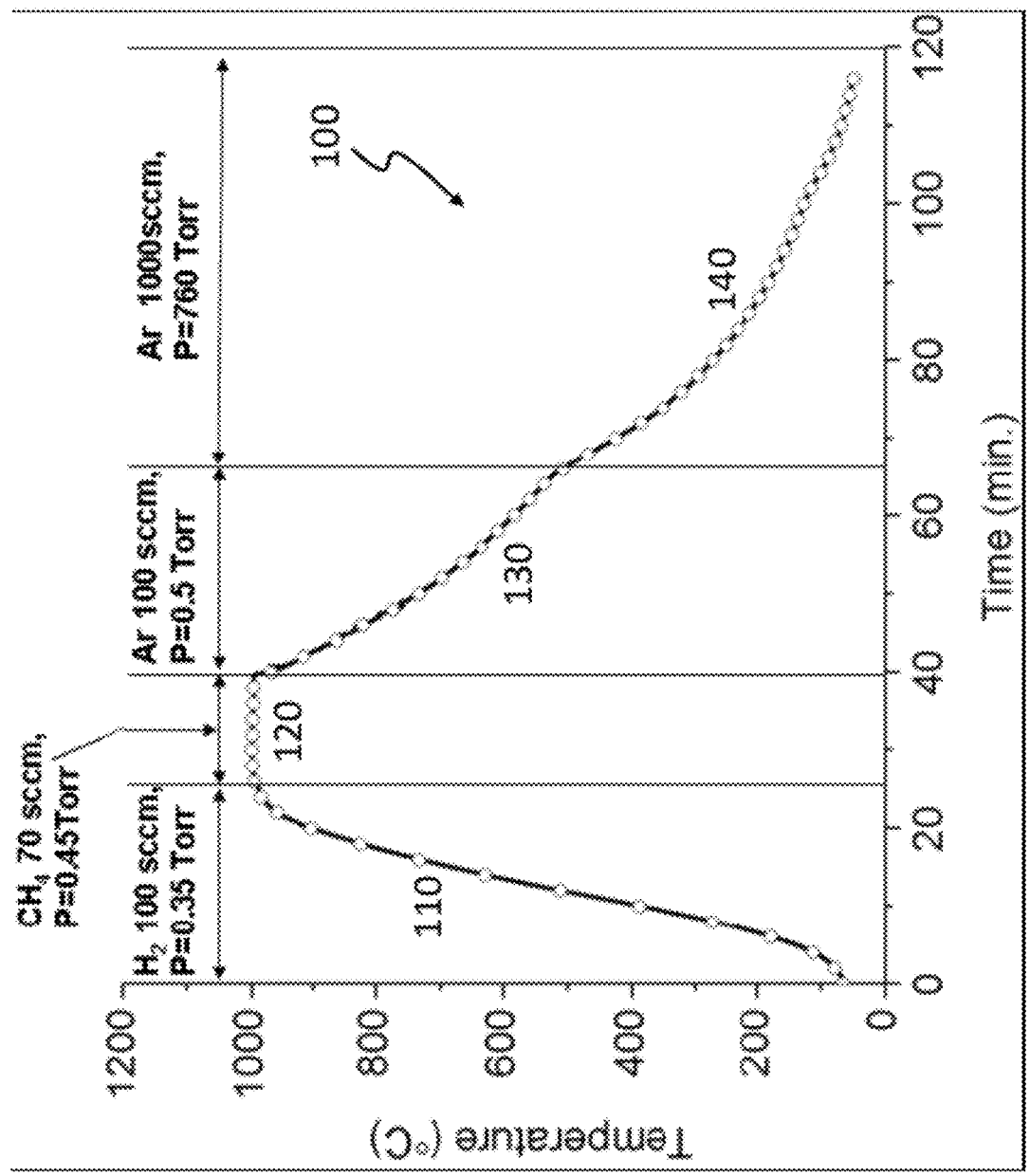
FIG. 5 is a plot of temperature vs. time for a producing uniform multilayer graphene by CVD, according to one specific embodiment.

In accordance with one embodiment, with some illustrative examples of method steptime periods labeled in FIG. 5, there is provided a method (100) of producing uniform multilayer graphene by chemical vapor deposition. In general, the method can include placing a substrate in a reaction chamber of a furnace, increasing the temperature in the reaction chamber to a desired level (step 110), and flowing a reaction gas in the reaction chamber after the temperature in the reaction chamber reaches the desired level (step 120). The flowing of the reaction gas may be performed without $H_2$ gas and/or at a low pressure in the reaction chamber (e.g., at less than about 1 Torr). The method also may include slowly decreasing the temperature in the reaction chamber (step 130), for example, at a controlled rate of less than 100° C./min. The reaction gas may be flowed in the chamber at a relatively low pressure compared to conventional processes, and the temperature in the reaction chamber may thereafter be decreased relatively slowly compared to conventional processes.

The method may include placing a substrate in a reaction chamber or quartz tube of a furnace. The substrate can be composed of any suitable metal and can be of any suitable construction. For example, the metal substrate can be composed of copper and can be of foil construction. Other examples can include a surface layer of thermally evaporated or electron beam evaporated copper on other substrates.

After placing the substrate in the reaction chamber, the chamber may be evacuated. For example, the reaction chamber can be evacuated to a pressure of about 0.1 Torr, or any other suitable pressure to prevent outside particles or gases from entering the reaction chamber. As used herein, the term "about" means within plus or minus fifteen percent. Also, those of ordinary skill in the art will recognize that at least some of the parameters disclosed herein are specific to the experimental three-inch horizontal tube furnace described below, and the parameters can be scaled up or down depending on the actual furnace used.

After sufficient evacuation, the reaction chamber can be purged with a working gas. The term working gas can include an inert gas such as argon, helium, or any other suitable gas. After the reaction chamber is purged, $H_2$ gas can be flowed in the reaction chamber. In one example, the gas can be flowed at a flow rate of about 100 standard cubic centimeters per minute (sccm) and at a pressure in the reaction chamber of about 0.35 Torr. In other examples, any other gases can be used particularly if they are stable up to and including at least 1000° C., are suitable to reduce or deoxidize copper, and do not introduce impurities to the copper or the furnace. Of course, those of ordinary skill in the art will recognize that the desired amount of $H_2$ depends on the amount of copper that is used to grow the graphene. A suitable vacuum is maintained to prevent gases other than the introduced hydrogen, such as those from the outer environment, from reaching the copper substrate in the reaction chamber. The flow rate and vacuum level can be varied to ensure that the substrate is mostly in a hydrogen environment during heating.

The temperature in the reaction chamber is increased to a desired value. In one example, the temperature in the reaction chamber is increased to about 1000° C. In another example, the temperature in the reaction chamber can be increased to a value between 800° C. and 1050° C. This step can occur simultaneously or overlap with the step of flowing $H_2$ gas in the reaction chamber.

After the temperature in the reaction chamber reaches the desired value, a reaction gas may be flowed in the reaction chamber. In those embodiments where $H_2$ gas has been flowed in the reaction chamber, flow of the $H_2$ gas can be ceased. It is believed that defect level and trilayer growth can occur, and their instances may increase, with the presence and/or increases in the amount of $H_2$ gas during flow of the reaction gas. In one example, the reaction gas can be methane ($CH_4$) gas. In another example, the reaction gas can be ethane or any other suitable alkane gas. In a further example, the reaction gas can be acetylene or any other suitable alkyne gas. Additional examples for the reaction gas can include methanol gas, ethanol gas, or the like. In other examples, the reaction gas can include any gas or gas mixture suitable to produce carbon nanotubes or graphene. The reaction gas can be flowed in the reaction chamber at a flow rate of about 70 sccm for a period of about fifteen minutes and at a pressure in the reaction chamber of about 0.45 Torr. In another example, the reaction gas can be flowed in the reaction chamber at a flow rate of between 35 to 70 sccm for a period of between three and sixty minutes and at a pressure in the reaction chamber of less than 0.5 Torr. In another example, the reaction gas can be flowed in the reaction chamber at a pressure in the reaction chamber of less than 1 Torr.

Next, the temperature in the reaction chamber can be slowly decreased while flowing at least one of the working gas, the reaction gas, or $H_2$ gas in the reaction chamber. In one example, the temperature in the reaction chamber can be decreased at a rate of about 18° C./min and the working gas or the reaction gas can be flowed in the reaction chamber at a flow rate of about 100 sccm and at a pressure in the reaction chamber of about 0.5 Torr. In another example, the temperature in the reaction chamber can be decreased at a rate of between 18° C./min and 36° C./min and the working gas can be flowed in the reaction chamber at a flow rate of between 35 to 70 sccm and at a pressure in the reaction chamber of between 0.45 and 0.5 Torr. In a further example, the temperature in the reaction chamber can be decreased at a rate less than 100° C./min.

Thereafter, a working gas can be flowed in the reaction chamber while the temperature in the reaction chamber continues to decrease (step 140). In one example, the working gas can be flowed in the reaction chamber at a flow rate of about 1000 sccm and at a pressure in the reaction chamber of about 760 Torr.

The above-described method of synthesizing uniform multilayer graphene by CVD may be extended to additional embodiments that include physically stacking together any number of uniform sheets of graphene, whether single layer or multilayer, to arrive at uniform multilayer graphene sheets. For example, a transparent conductor for use in certain electronics application like touch screen displays may be produced using uniform multilayer graphene films or sheets that include a plurality of graphene layers synthesized by chemical vapor deposition. Increased numbers of graphene layer, particularly when doped, can significantly reduce the electrical resistance of a graphene film. Using CVD to synthesize uniform multilayer graphene to stack with other graphene layers may offer certain advantages when compared to the complexities of stacking a plurality of single layer graphene films.

In accordance with one embodiment, a method of making a multilayer graphene film generally includes the steps of synthesizing uniform multilayer graphene by chemical vapor deposition, providing a uniform graphene sheet having at least one layer of graphene, and stacking the CVD-synthesized uniform multilayer graphene together with the provided uniform graphene sheet.

The step of synthesizing uniform multilayer graphene may be accomplished according to the method already described in some of its various embodiments. Bilayer graphene is one type of multilayer graphene that can be synthesized using the method.

The step of providing a uniform graphene sheet or film may also be performed by synthesizing uniform multilayer graphene by CVD as described so that the step of stacking includes stacking together two uniform multilayer graphene structures. However, the step of providing may include any other known method of providing a uniform graphene sheet. For example, CVD may be used under certain conditions to provide a single layer graphene sheet, which is uniform. In one embodiment, the step of providing a uniform graphene sheet may include providing a graphene sheet having a single graphene layer or multiple graphene layer that has previously been transferred on or over a target substrate such as a silicon wafer or other substrate.

The step of stacking the synthesized graphene and the provided graphene may be accomplished by a transfer process or by some other conventional technique. Examples of transfer processes will be described in more detail below, included a PMMA transfer process, for example. In one embodiment, either one or both of the graphene structures from the synthesizing step or the providing step includes synthesizing uniform bilayer graphene. Additionally, one or more of the graphenes synthesized or otherwise provided for stacking may be doped with a suitable dopant such as nitric acid to increase the electrical conductivity of the graphene and the resulting film.

In accordance with one or more embodiments of the above-described CVD method, previously unknown uniform multilayer graphene structures can be produced and described. In one embodiment, there is provided a multilayer graphene film having interlayer uniformity and the same number of graphene layers throughout a major portion of the sheet. The multilayer film is a bilayer graphene film in a preferred implementation. A graphene sheet or film so described is considered uniform as defined above. Embodiments of the above-described method can produce a multilayer graphene film wherein 50% or more of the film has the same number of graphene layers. Other embodiments can produce multilayer graphene films having the same number of graphene layers throughout about 70% of more of the film. As described herein, graphene films wherein 99% or more of the film or substantially all of the film includes the same number of layers can be produced.

In an exemplary embodiment of a product that may be produced using the uniform multilayer graphene produced by the above method, a transparent conductor is provided that includes uniform multilayer graphene directly synthesized by CVD. In another implementation, the transparent conductor may include a plurality of uniform bilayer graphene films synthesized by chemical vapor deposition and stacked together.

Experimental Data

Uniform multilayer graphene has been experimentally produced by at least one embodiment of the above-described method. The specific embodiments produced, tested, and characterized will now be described below with reference to the Figures.

Figure 1B:
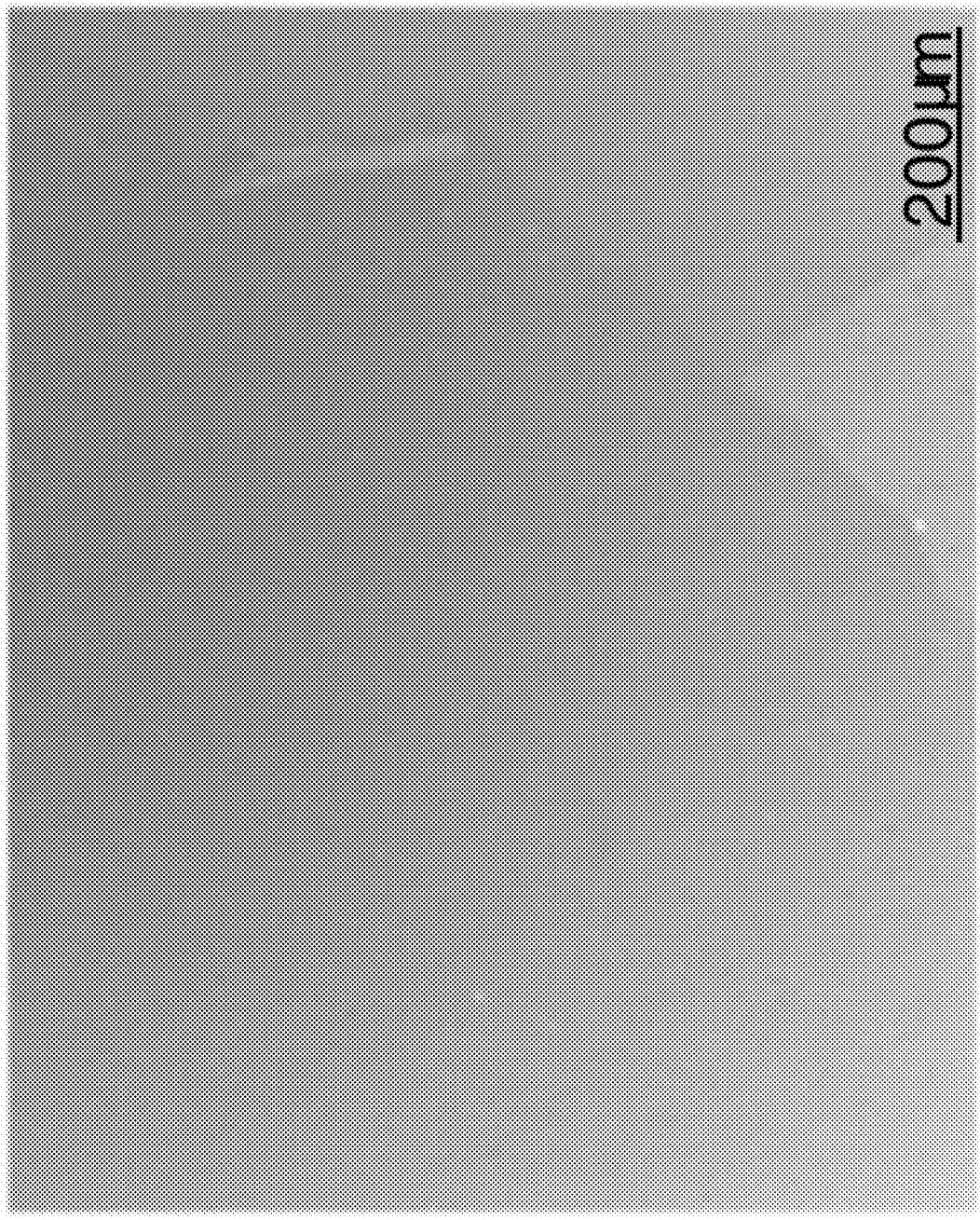
FIG. 1(b) is an optical microscopy image showing an edge of the bilayer graphene film of FIG. 1(a)

FIG. 1(*a*) is photograph of a wafer scale or macro scale (2 inch×2 inch) multilayer graphene film 10, specifically a bilayer graphene film, produced by one embodiment of the above-described method and transferred onto a 4 inch silicon wafer with 280 nm thick $SiO_2$. FIG. 1(*b*) is an optical microscope image of the transferred graphene film showing almost no color variation except for the region where the film is torn and folded in the lower right portion of the image. To identify the number of layers in the graphene sheet, Raman spectroscopy was performed at ten randomly chosen locations across the film. The spectra were compared with reference samples prepared by mechanically exfoliating Kish graphite.

Figure 6A:
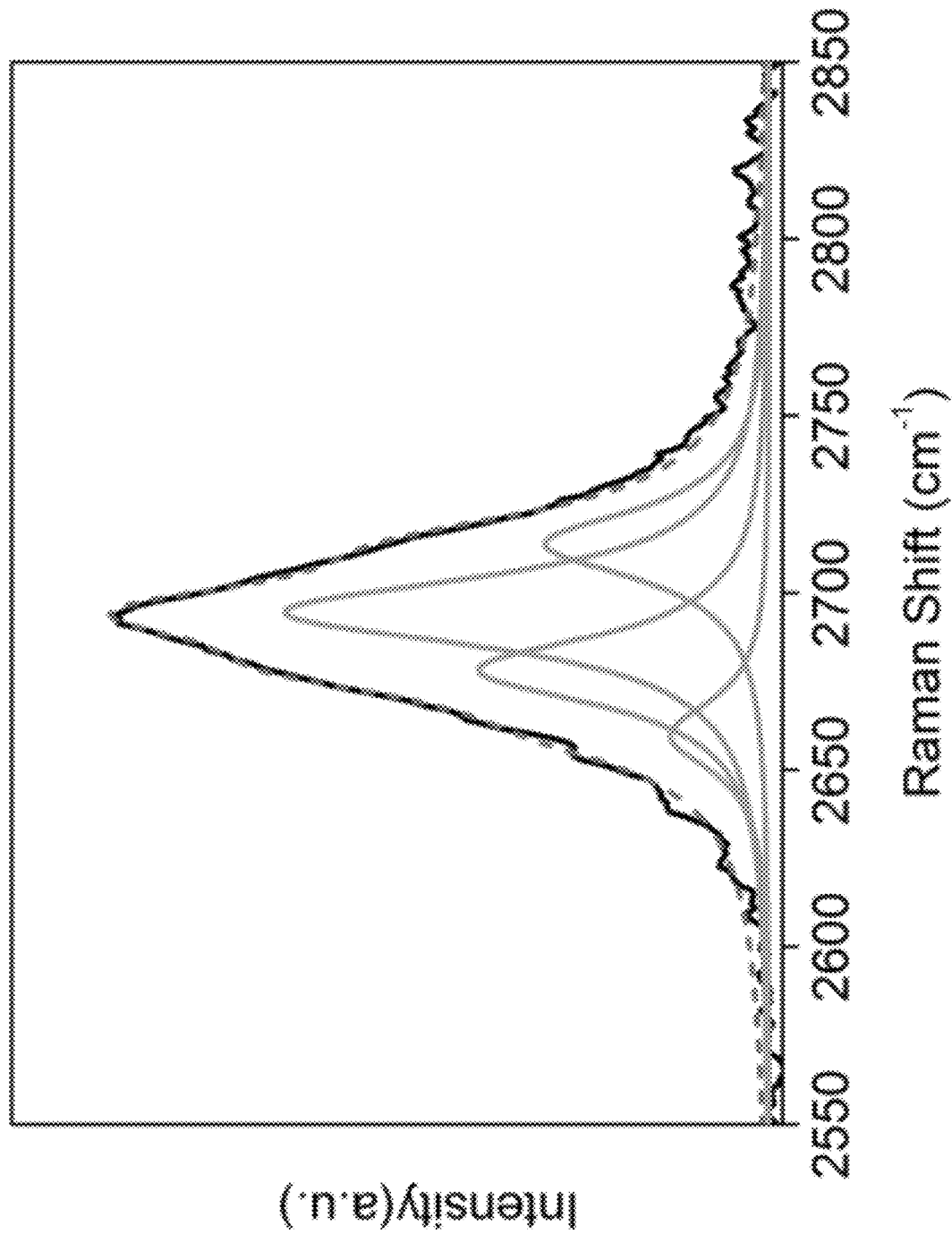
FIG. 6(a) shows a measured 2D Raman band of bilayer graphene with FWHM of 45 cm–1, wherein a peak (uppermost curve) is well-fitted with a sum of four single Lorentzian peaks (four lowermost curves) of 24 cm–1 FWHM.
Figure 6B:
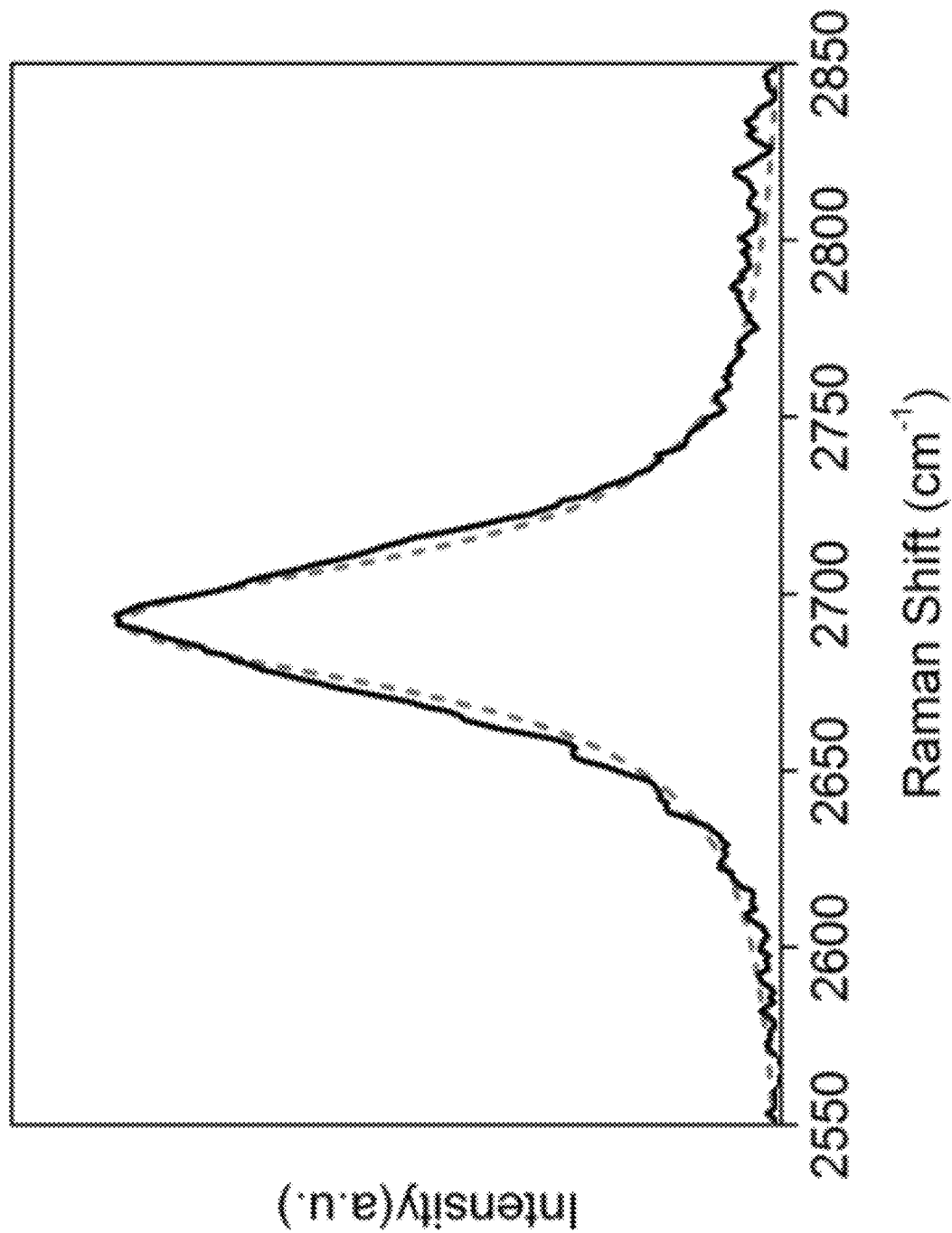
FIG. 6(b) illustrates a single Lorentzian fit (dashed line) of the same data of FIG. 6(a), showing deviation from a measured 2D band.

The lower curve in FIG. 1(*c*) represents a typical Raman spectrum from the produced graphene sheet. Two peaks are clearly visible between Raman shift values of 1250 cm$^{-1}$ and 2850 cm$^{-1}$, with one corresponding to the G band (~1595 cm$^{-1}$), and another to the 2D band (~2691 cm$^{-1}$). The spectrum exhibits several distinctive features. First, the 2D band shows higher peak intensity than the G band with a 2D-to-G intensity ratio $I_{2D}/I_G$ of about 2.31, suggesting that the number of graphene layers is less than 3. Second, the full width at half maximum (FWHM) of the 2D band peak is measured to be about 45 cm$^{-1}$, exceeding the cut-off of ~30 cm$^{-1}$ for single-layer graphene. Third, the 2D band peak cannot be fit with a single Lorentzian peak (see FIG. 6(a)), but fitting with a sum of four Lorentzian peaks with a FWHM of 24 cm$^{-1}$ yields excellent agreement (see FIG. 6(b)). Raman spectra taken from the other 9 spots show similar features with the 2D band FWHM ranging from 43~53 cm$^{-1}$. These observations are reminiscent of characteristic bilayer graphene Raman spectrum and confirm the successful synthesis of wafer scale bilayer graphene film.

Figure 1C:
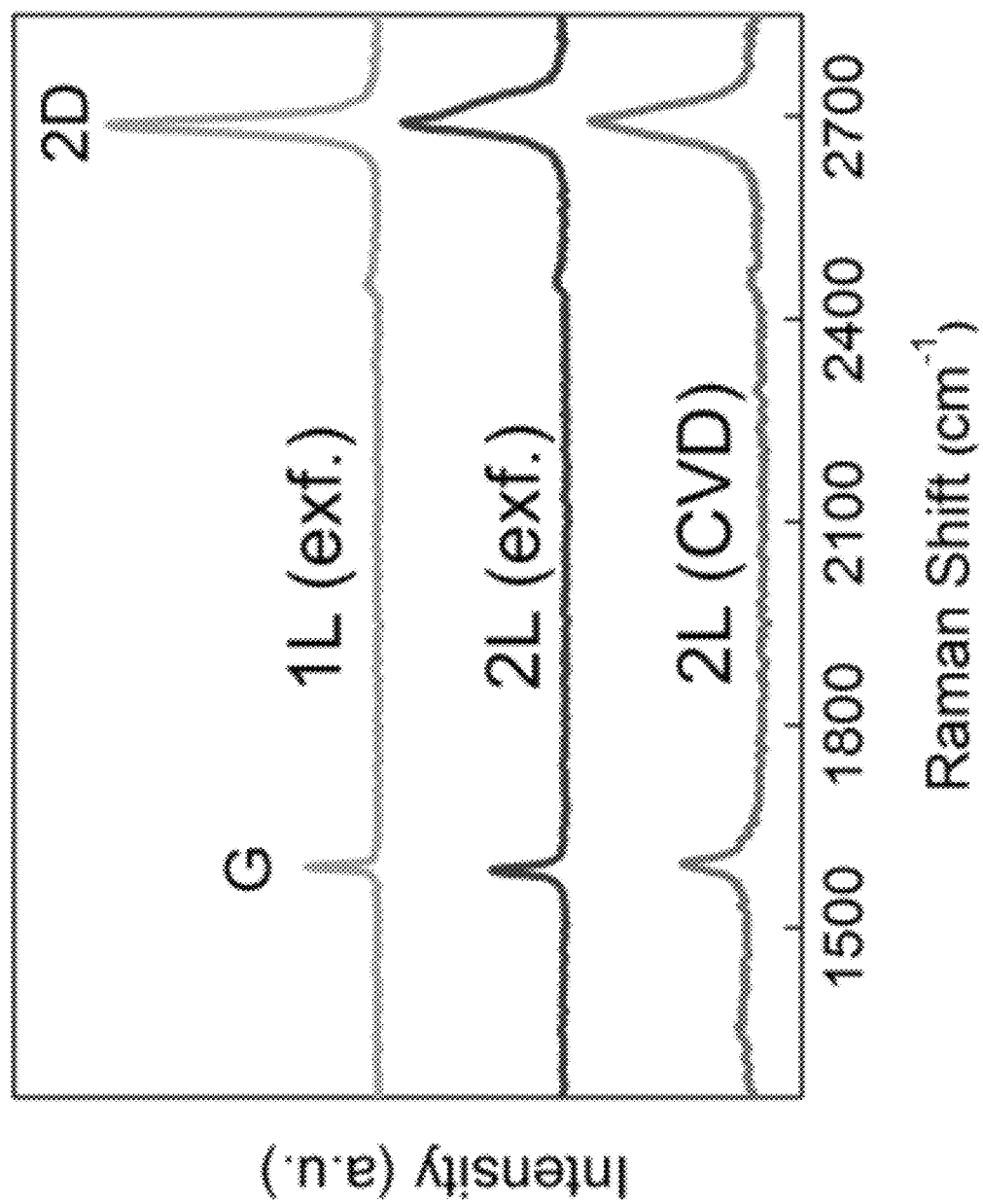
FIG. 1(c) shows Raman spectra from samples of CVD-grown bilayer graphene, exfoliated single-layer graphene, and exfoliated bilayer graphene, wherein the laser excitation wavelength is 514 nm.

Also shown in FIG. 1(c) are reference Raman spectra taken from exfoliated single-layer (top curve) and bilayer (middle curve) graphene under identical conditions as the CVD-produced graphene. Exfoliated single-layer graphene shows a 2D band FWHM of 24 cm$^{-1}$ and $I_{2D}/I_G$ of 3.79, while exfoliated bilayer graphene shows a FWHM of 46 cm$^{-1}$ and $I_{2D}/I_G$ of 2.25. Direct comparison with these exfoliated samples indicates that the graphene film synthesized according to the above-described CVD method is a bilayer film.

The uniformity of CVD-grown bilayer graphene film was examined with spatially resolved Raman spectroscopy, in which the identification of the number of graphene layers is based on the FWHM of 2D band and peak intensity ratio $I_{2D}/I_G$. FIG. 2(a) shows a map of the 2D band peak width over a 30 μm by 30 μm area, with FWHM values ranging from 42 cm$^{-1}$ (dark color) to 63 cm$^{-1}$ (light color). The data show uniformly distributed dark color with only a few localized light spots. The peak intensity ratios $I_{2D}/I_G$ are also mapped in FIG. 2(b) over the same area, with values ranging from 0.37 (dark color) to 3.77 (light color). A comparison of FIGS. 2(a) and 2(b) indicates that larger peak widths are consistent with smaller $I_{2D}/I_G$ ratios.

Figure 2B:
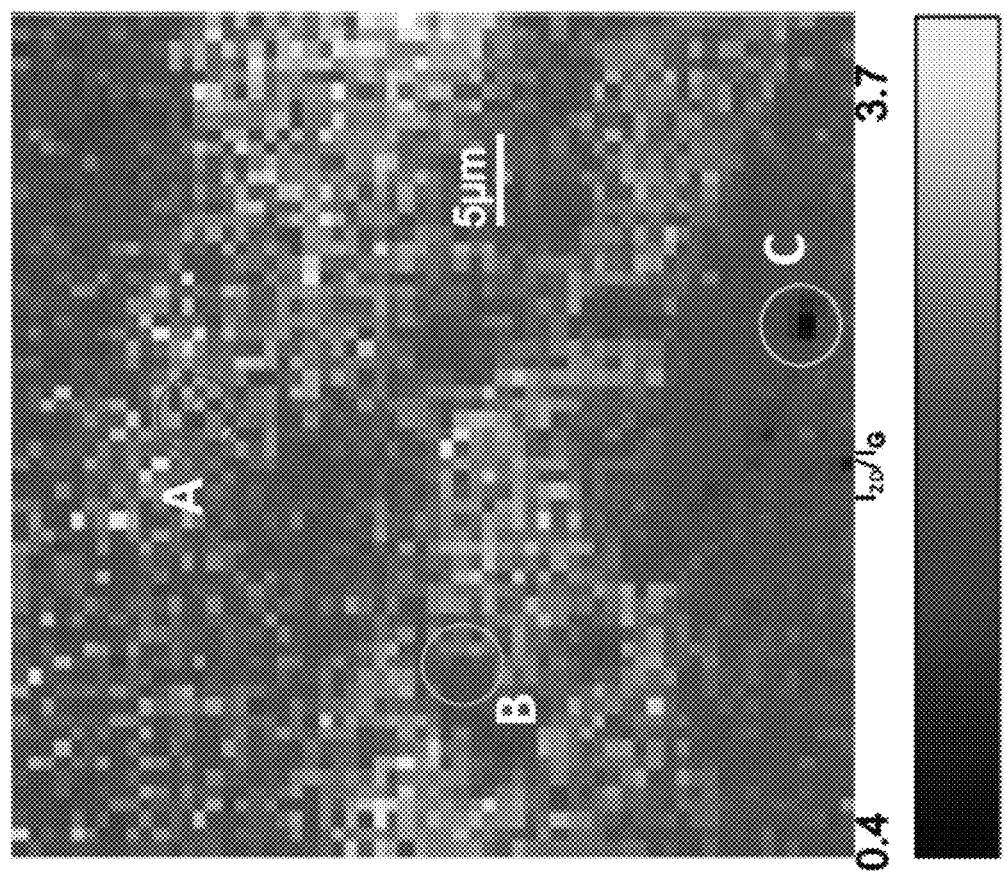
FIGS. 2(a) and 2(b) show spatially resolved Raman spectroscopy from a sample of CVD-grown bilayer graphene, with two-dimensional mapping over a 30 μm×30 μm area of: (a) FWHMs of Raman 2D band, and (b) $I_{2D}/I_G$ ratios.
Figure 2A:
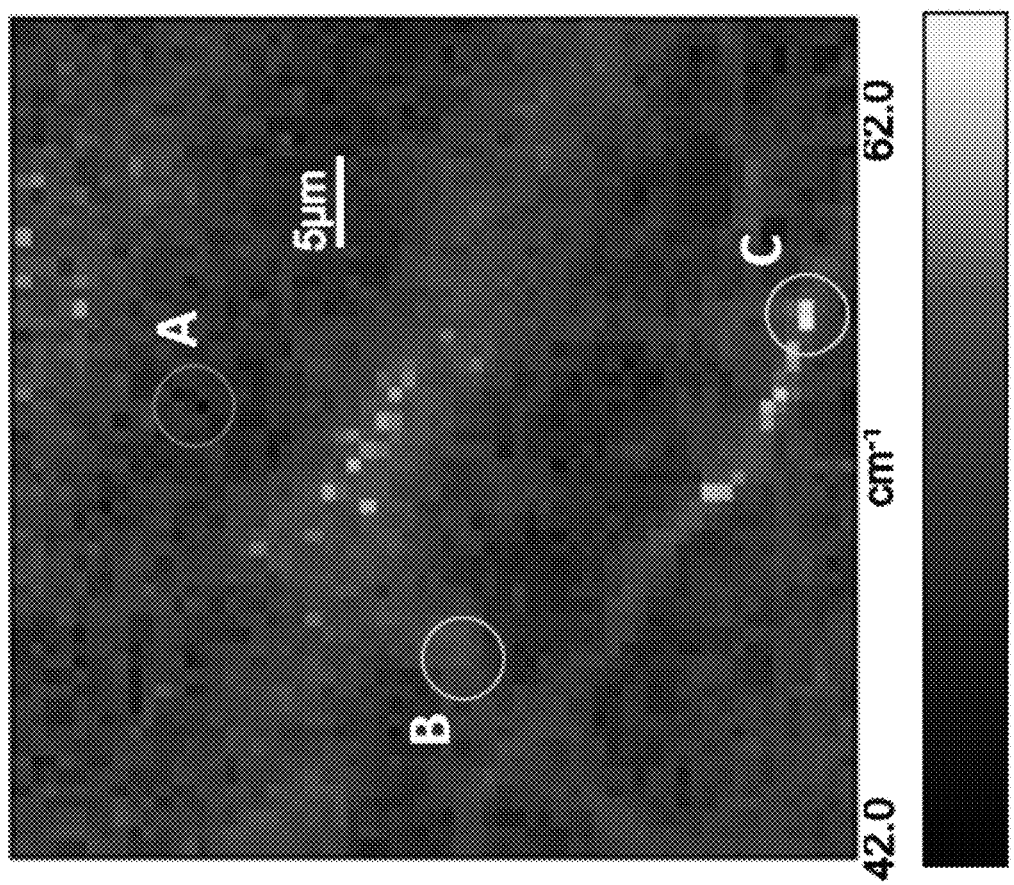
Figure 2C:
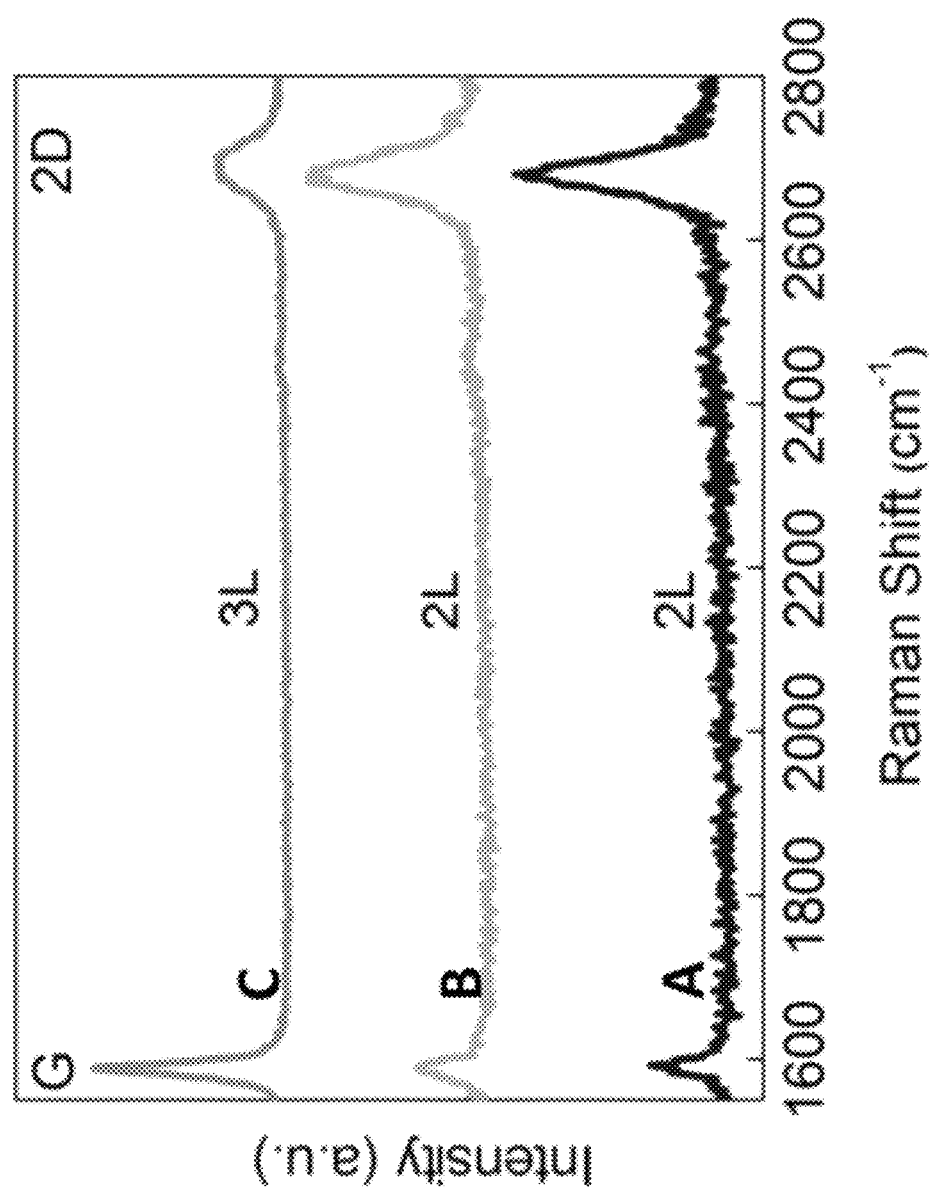
FIG. 2(c) shows Raman spectra from marked spots on the sample corresponding to circles showing bilayer and trilayer graphene.
Figure 6C:
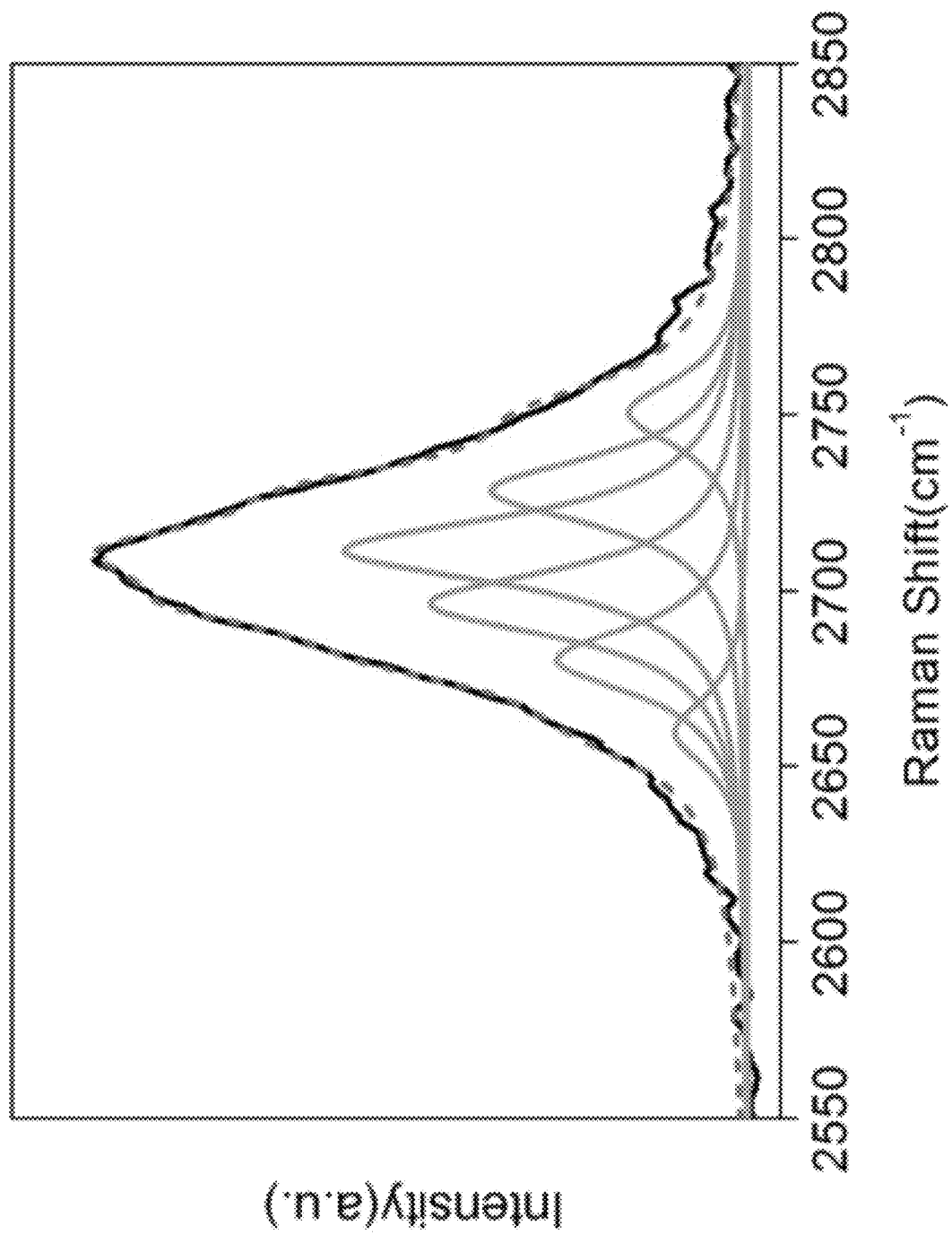
FIG. 6(c) shows a measured 2D Raman band of a trilayer graphene with FWHM of 62 cm–1, wherein a peak (uppermost curve) is well-fitted with a sum of six single Lorentzian peaks (six lowermost curves)

FIG. 2(c) compares the Raman spectra taken from three representative spots indicated at circles A, B, and C in FIGS. 2(a) and 2(b) and shown as the lower, middle and upper spectra, respectively, in FIG. 2(c). The Raman spectrum taken at circle "C" has the largest FWHM (62.9 cm$^{-1}$) and smallest $I_{2D}/I_G$ (0.37), indicating trilayer graphene (see FIG. 6(c)). Circle "B" shows FWHM=55 cm$^{-1}$ and $I_{2D}/I_G$=2.2, indicating bilayer graphene. Circle "A" shows FWHM=43.8 cm$^{-1}$ and $I_{2D}/I_G$=2.91, indicating bilayer graphene. This shows that the CVD-produced bilayer graphene film is highly uniform, with only a very small fraction corresponding to possibly 3 layers.

Figure 2D:
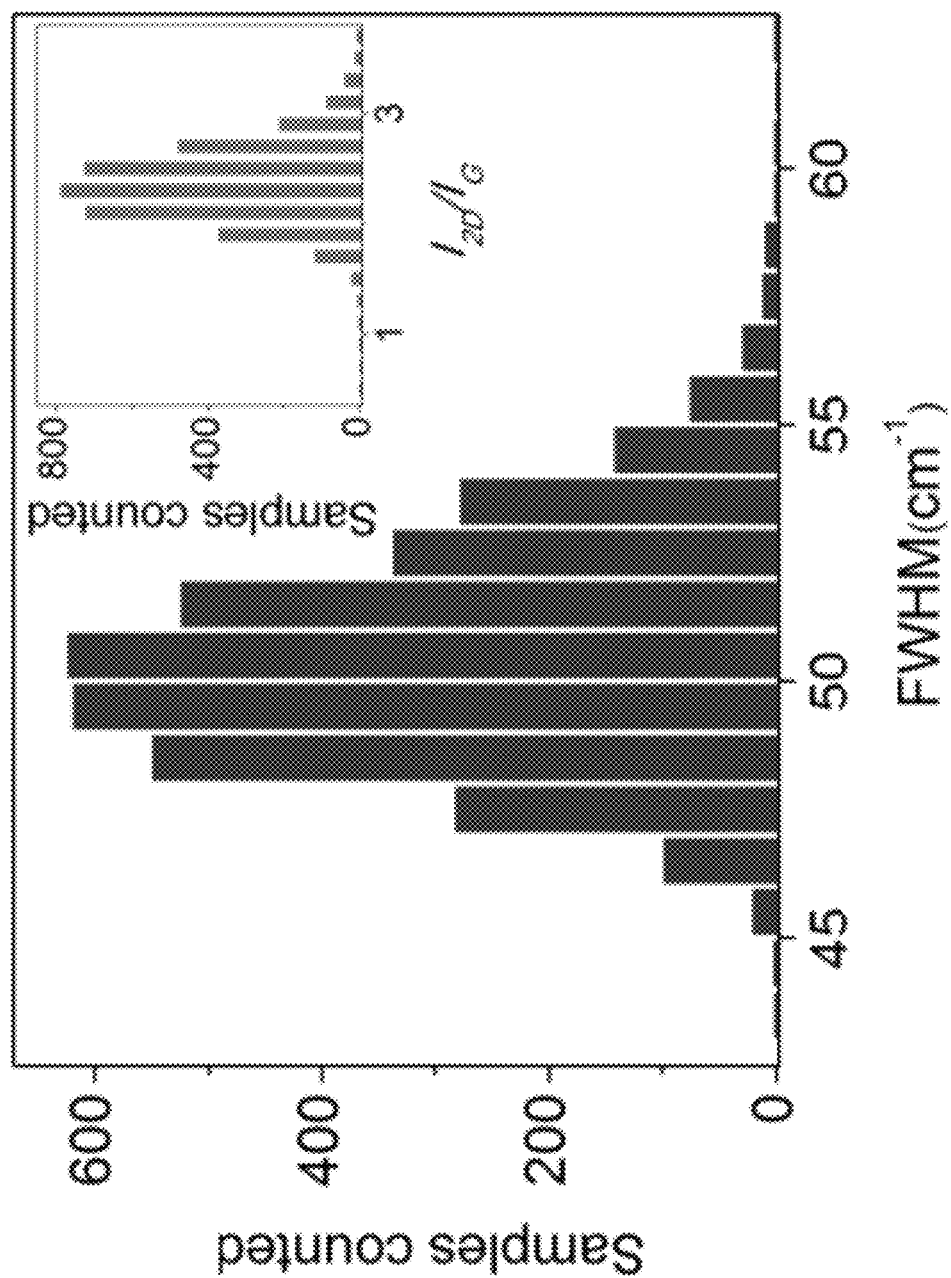
FIG. 2(d) is a histogram of the FWHMs of Raman 2D band corresponding to the area shown in FIG. 2(a), with a top right inset histogram of $I_{2D}/I_G$ ratios for the same area.
Figure 2E:
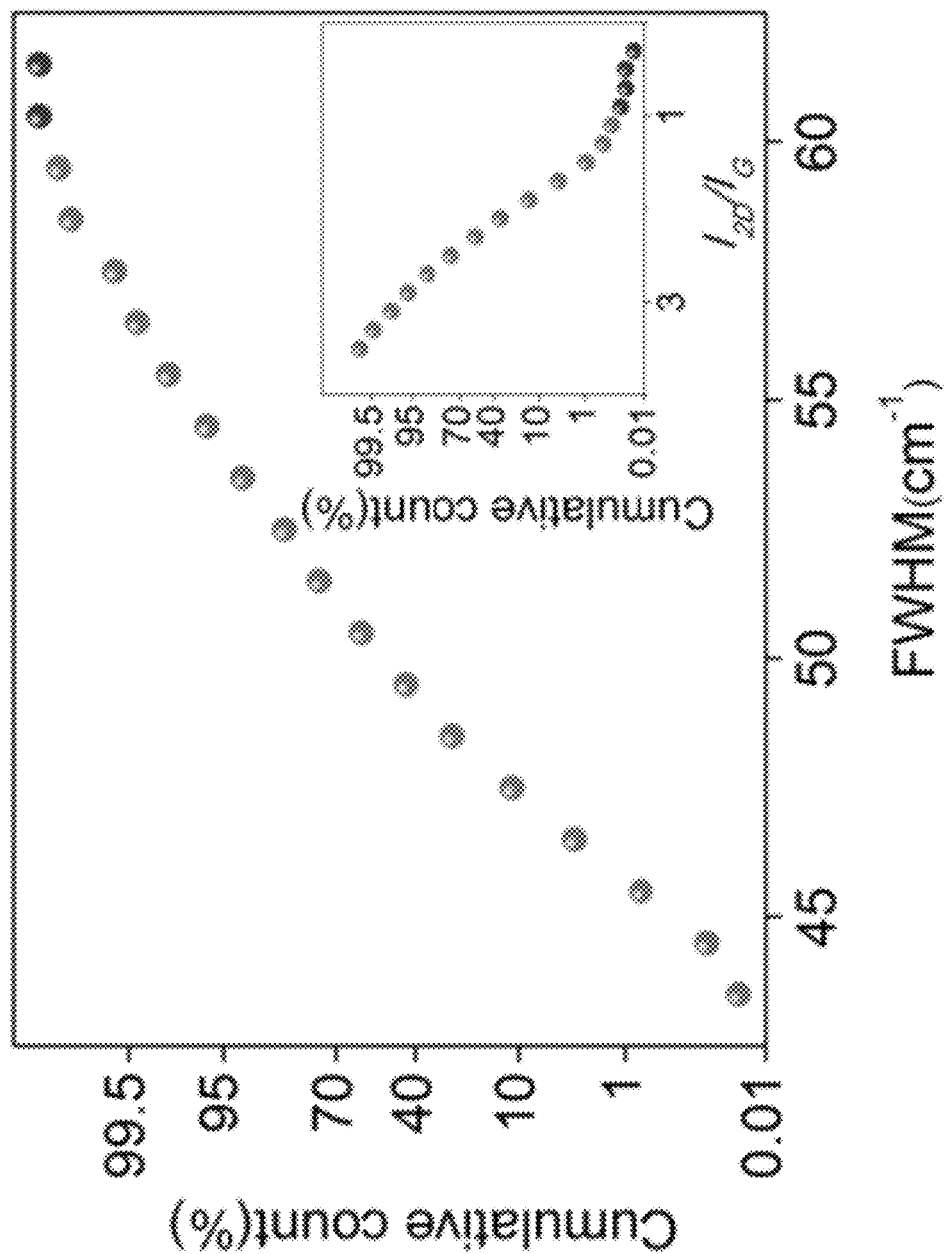
FIG. 2(e) is a cumulative count plot of FWHMs of Raman 2D band wherein two points are higher than 60 cm$^{-1}$. The plot includes a bottom right inset cumulative count plot of $I_{2D}/I_G$ ratios wherein four points are at ratios smaller than 1 (for Raman mapping, $\lambda_{laser}$=514 nm, 500 nm step size, 100× objector)

Bilayer graphene coverage was examined by studying the statistics of 2D band peak width and $I_{2D}/I_G$ ratio. FIG. 2(d) illustrates is histogram of the FWHMs of 2D bands taken from the Raman mapping. The average peak width was determined to be 51±2 cm$^{-1}$. Cumulative counts are plotted in FIG. 2(e) indicating that more than 99% of the FWHM values are below 60 cm$^{-1}$. In addition, the inset histogram of $I_{2D}/I_G$ ratios in FIG. 2(d) shows an average value of 2.4±0.4, and the corresponding cumulative count plot in the FIG. 2(e) inset shows that more than 99% of $I_{2D}/I_G$ ratios are larger than 1. Using FWHM=60 cm$^{-1}$ together with $I_{2D}/I_G$=1 as crossover values between bilayer and trilayer graphene, the data show that the produced multilayer graphene film includes the same number of layers throughout about 99% of the sample, and the number of layers is two so that the multilayer graphene is uniform bilayer graphene. Less than 1% of the sample was trilayer graphene.

Figure 3A:
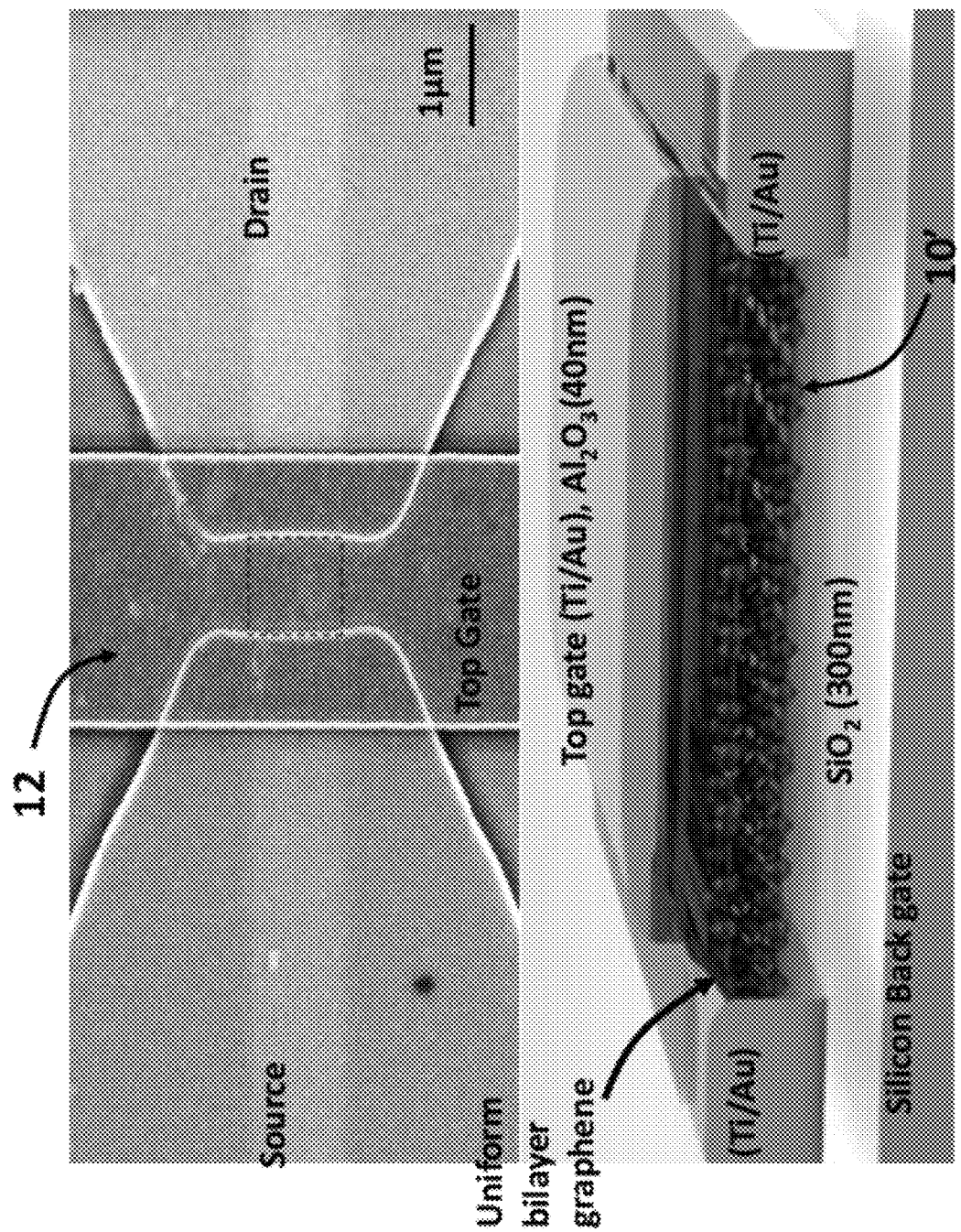
FIG. 3(a) is a scanning electron microscopy (SEM) image (top) and an illustration (bottom) for electrical transport studies on a dual-gate bilayer graphene device, wherein the dashed square in the SEM image indicates a 1 μm×1 μm bilayer graphene piece underneath a top gate.

The CVD-produced bilayer graphene was also characterized via electrical transport measurements. Dual-gate bilayer graphene transistors 12 were fabricated with three different dimensions: channel lengths and channel widths of 1 μm×1 μm, 1 μm×2 μm, and 2 μm×2 μm. A scanning electron microscope (SEM) image and an illustration of the fabricated device 12 are shown in FIG. 3(a). All semiconductor devices had a local top gate and a universal silicon bottom gate with $Al_2O_3$ (40 nm) and $SiO_2$ (310 nm) as the respective gate dielectrics. This dual-gate structure allows simultaneous manipulation of bilayer graphene bandgap and the carrier density by allowing independently induced electric fields in both directions. The bottom illustration includes a cross-section through the uniform multilayer graphene, more specifically, bilayer graphene 10'.

Figure 3B:
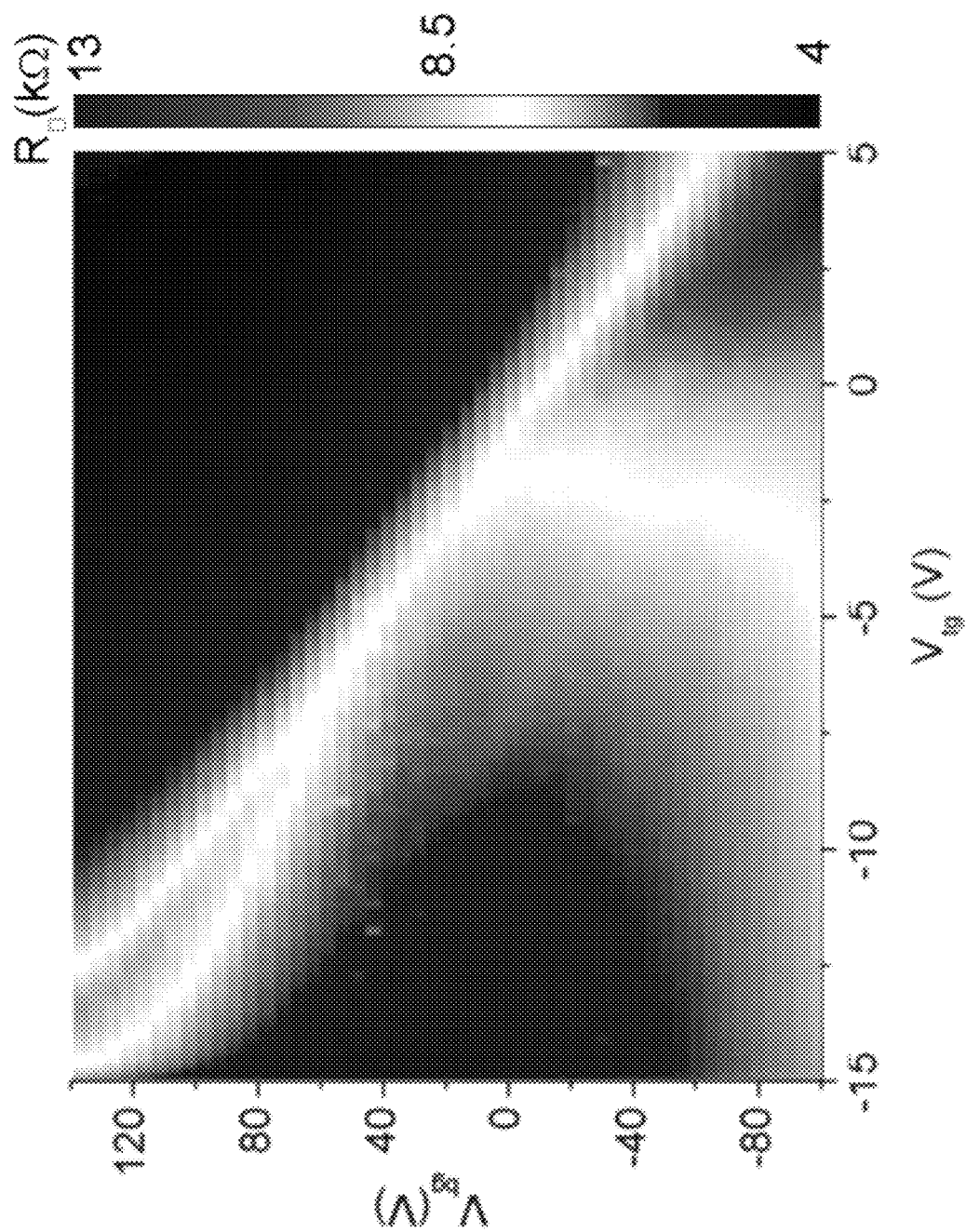
FIG. 3(b) is a two dimensional plot of square resistance $R_\square$ vs. top gate voltage $V_{tg}$ and back gate voltage $V_{bg}$ at a temperature of 6.5K.
Figure 3C:
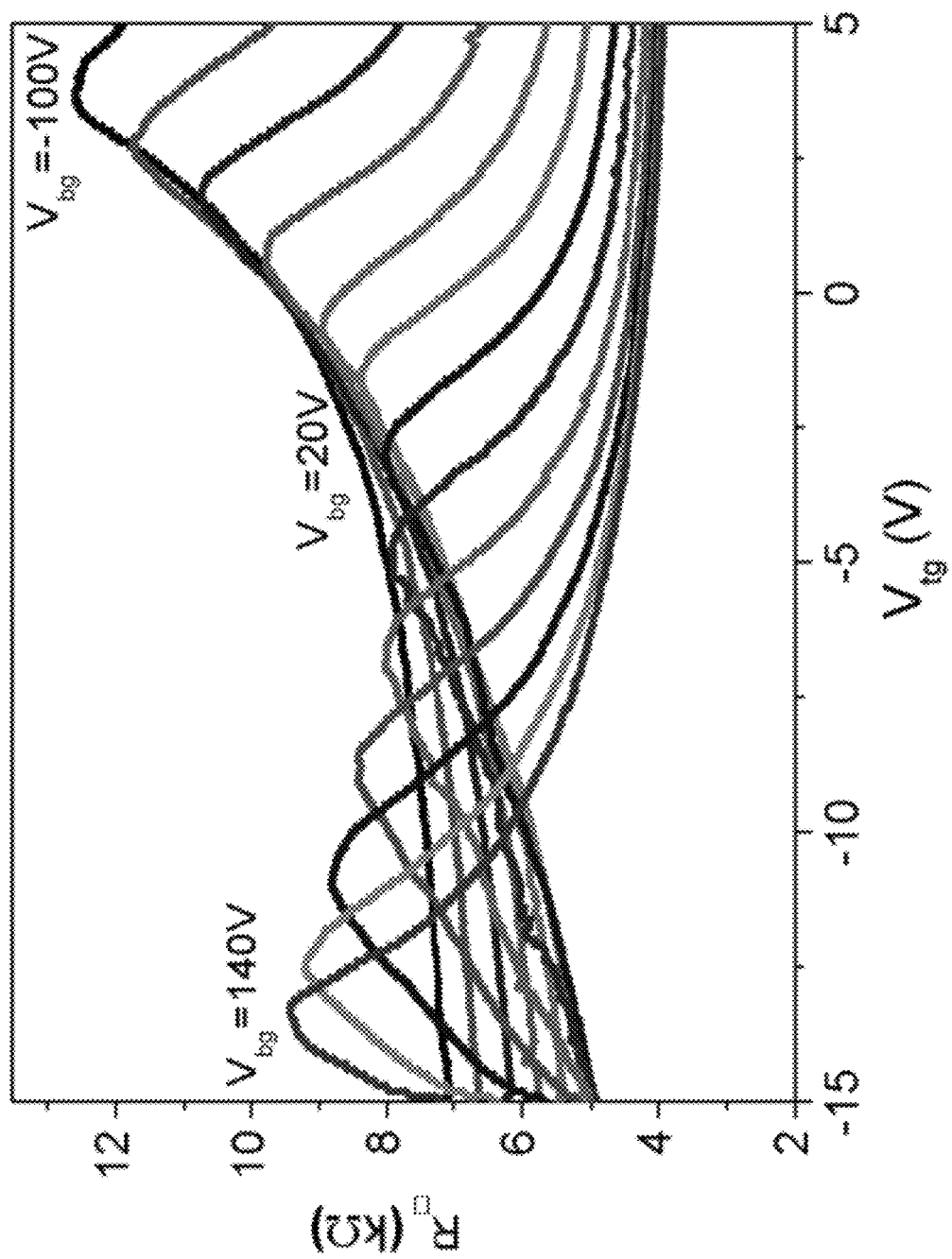
FIG. 3(c) is a plot of $R_\square$ vs. $V_{tg}$ at different values of fixed $V_{bg}$, including a series of curves from $V_{bg}$ of –100V to 140V, and a 20V increment.

FIG. 3(b) is a two dimensional color plot of square resistance $R_\square$ vs. top gate voltage ($V_{tg}$) and bottom gate voltage ($V_{bg}$), obtained from a typical 1×1 μm device at 6.5 K. The lighter diagonal region and darker regions on either side of the diagonal represent high and low square resistance, respectively. The data shows that $R_\square$ reach peak values along the diagonal, indicating a series of charge neutral points (Dirac points) when the top displacement fields cancel out the bottom displacement fields. The peak square resistance, $R_{\square, Dirac}$, reaches maximum at the upper left and lower right corner of the graph, where the average displacement fields from the top and bottom gates are largest. Horizontal section views of the plot in FIG. 3(b) are shown in FIG. 3(c), with $R_\square$ plotted against $V_{tg}$ at fixed $V_{bg}$ from −100 to 140 V.

Figure 3D:
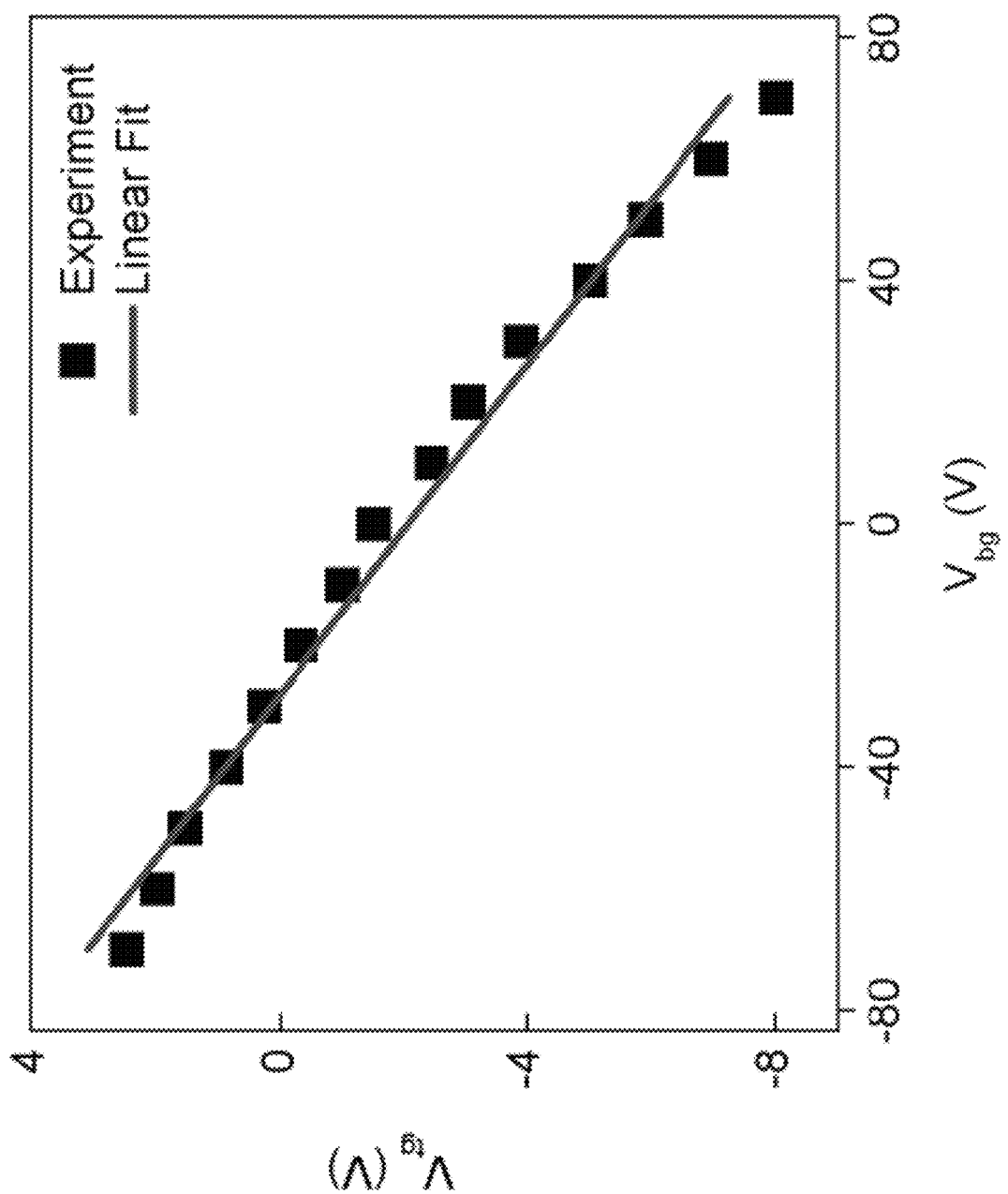
FIG. 3(d) is a plot of charge neutral points indicated as a set of ($V_{tg}$, $V_{bg}$) values at a peak square resistance $R_{\square,dirac}$, wherein the line is the linear fit and the electrical measurements were carried out in a closed cycle cryogenic probe station (LakeShore, CRX-4K) using a lock-in technique at 1 kHz with AC excitation voltage of 100 μV.

For each $R_\square$ vs. $V_{tg}$ curve, square resistances exhibit a peak value, and $R_{\square, Dirac}$ increases with increasing $V_{bg}$ in both the positive and negative direction. The charge neutral points are further identified in FIG. 3(d) in terms of the ($V_{tg}$, $V_{bg}$) values at $R_{\square, Dirac}$. A linear relationship between $V_{tg}$ and $V_{bg}$ is observed with a slope of −0.073. This agrees with the expected value of $-\varepsilon_{bg}d_{tg}/\varepsilon_{tg}d_{bg}=-0.067$, where ε and d correspond to the dielectric constant and thickness of the top gate ($Al_2O_3$: $d_{tg}$=40 nm, $\varepsilon_{tg}$=7.5) and bottom gate ($SiO_2$: $d_{bg}$=310 nm, $\varepsilon_{bg}$=3.9) oxide. There is a deviation from linear at high field, the origin of which is not well-understood and may require further study.

Figure 7B:
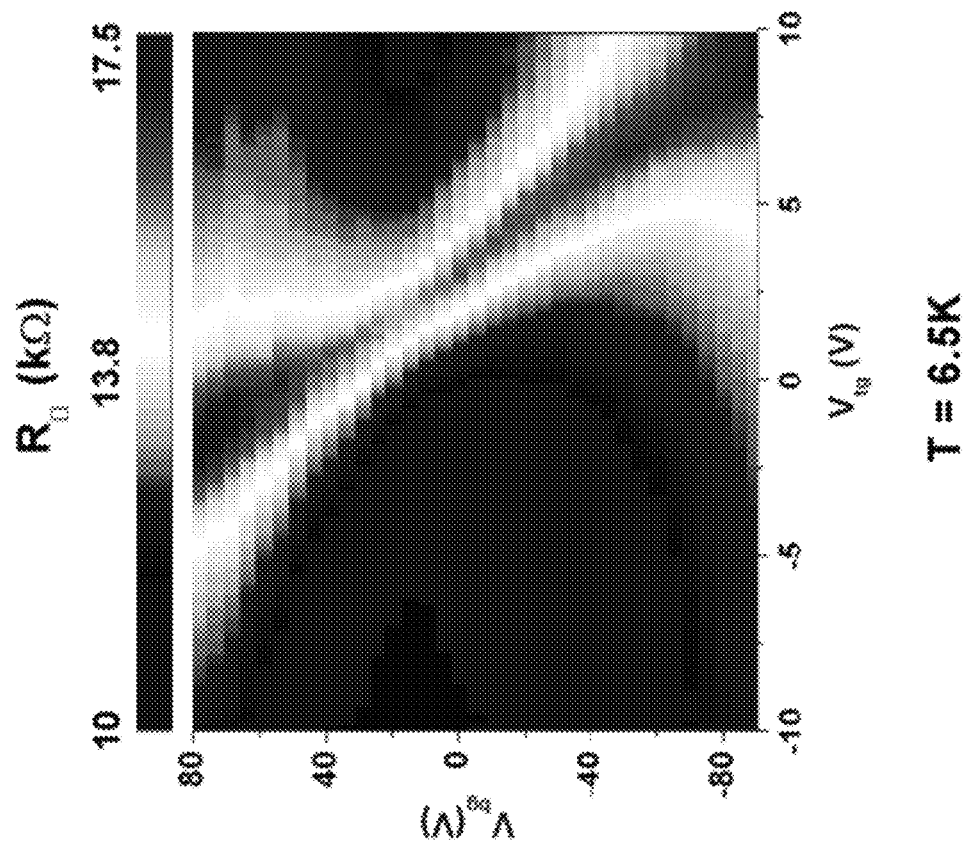
FIGS. 7(a)-7(c) depict three dual-gate graphene devices exhibiting bilayer transport behavior.
Figure 7A:
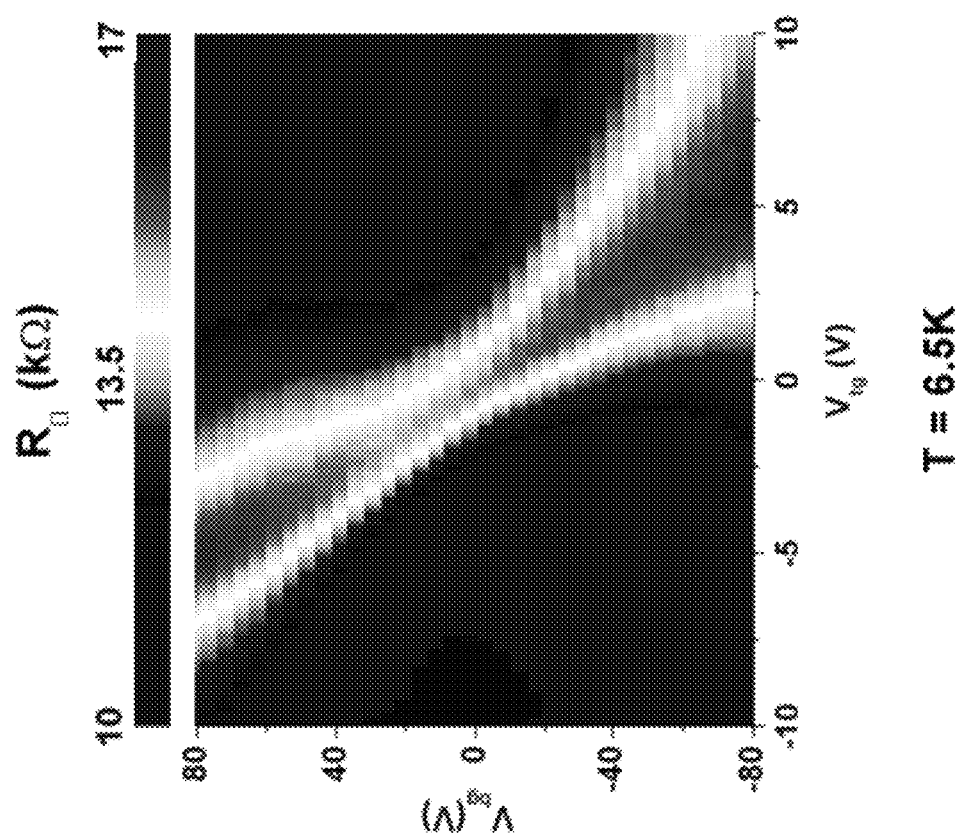
Figure 7C:
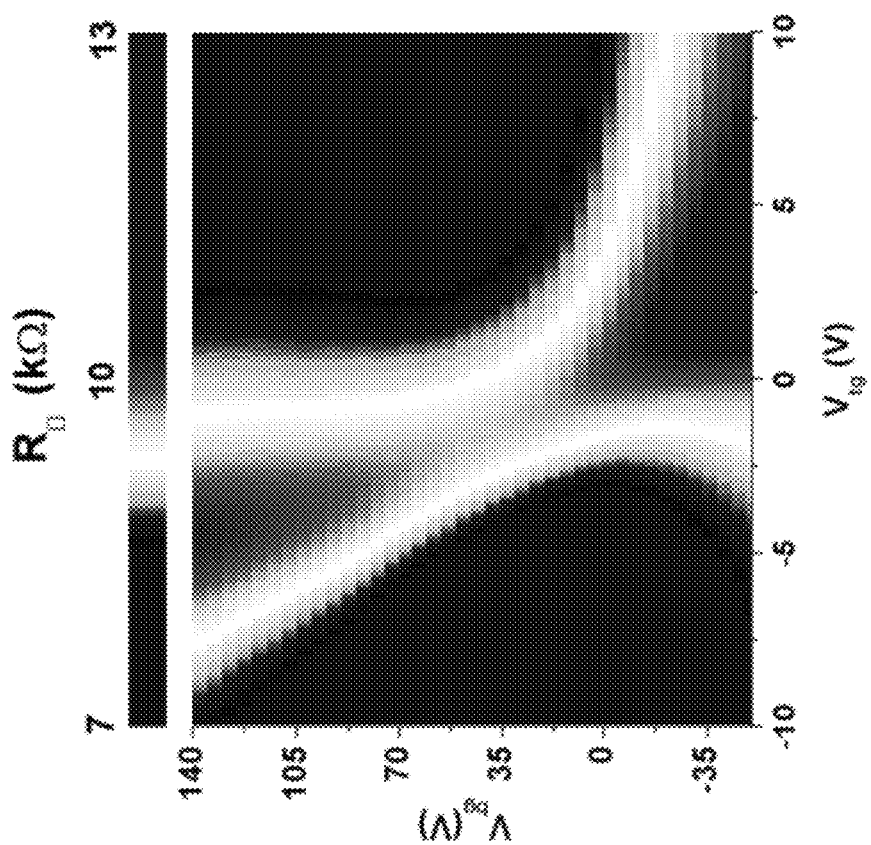

Similar results from three other devices are shown in FIGS. 7(a)-(c), and more than 46 measured devices showed qualitative agreement. These electrical characterizations further indicate of that bilayer graphene was synthesized by an embodiment of the above-described CVD method. The observation of increasing $R_{\square, Dirac}$ values at higher fields is a sign of bandgap opening in bilayer graphene. In comparison, the peak resistance at the charge neutral point should remain roughly constant for single-layer graphene, while $R_{\square, Dirac}$ decreases at higher field for trilayer graphene. It is noted that the CVD-grown bilayer graphene devices exhibit large fluctuations of the offset voltage, possibly from impurity and surface doping, with some cases exceeding 140 V for the bottom gate. This may be caused by ion residues from the etching process.

Figure 4A:
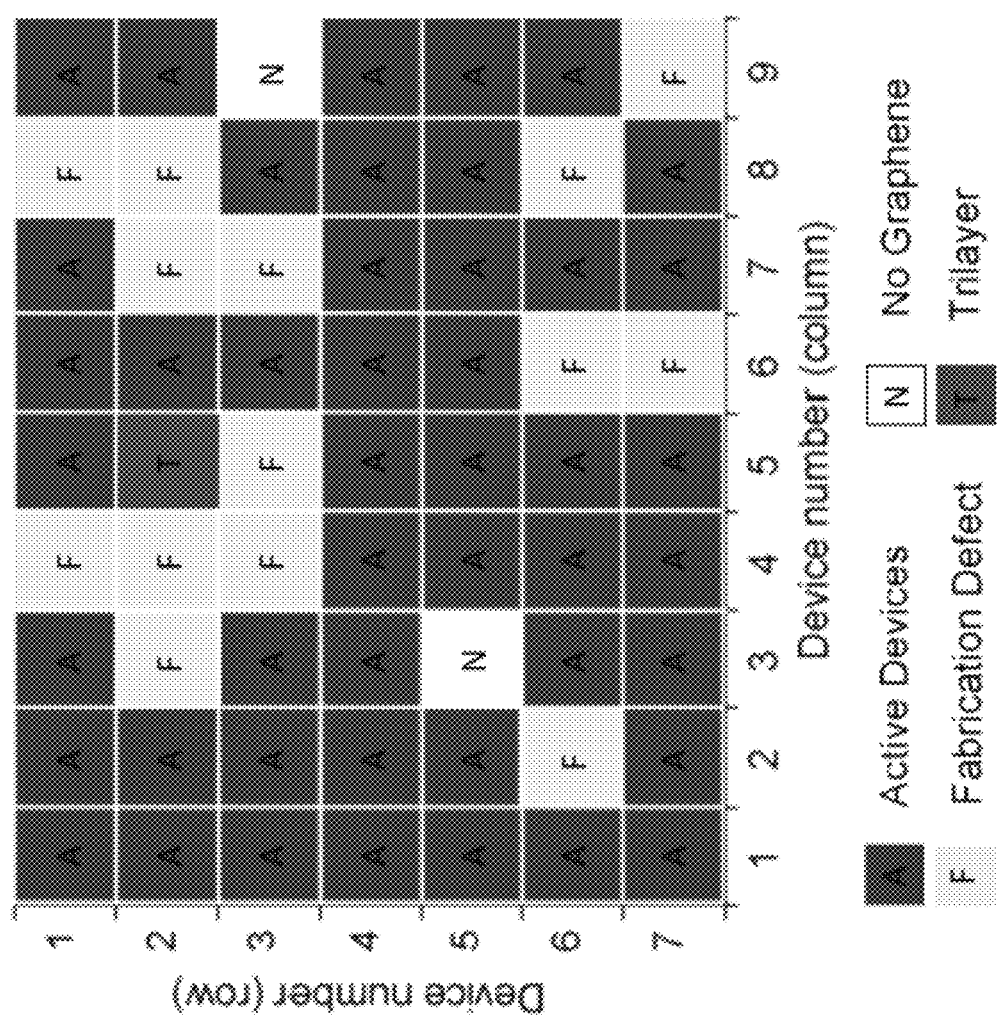
FIG. 4(a) illustrates results from electrical transport measurement on dual-gate graphene devices in the form of a coded map of 63 devices (7 rows×9 columns) fabricated across the same graphene film.
Figure 8A:
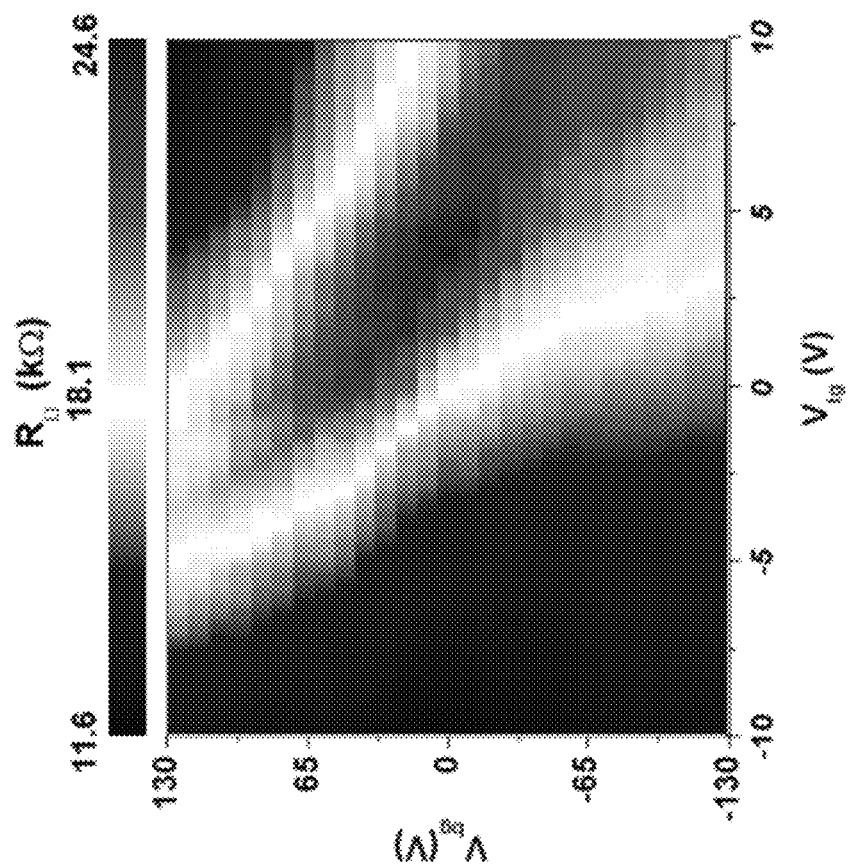
FIG. 8(a) depicts a graphene device exhibiting trilayer transport behavior, wherein an observed peak square resistance decreases with increasing field which is different from typical bilayer response.
Figure 8B:
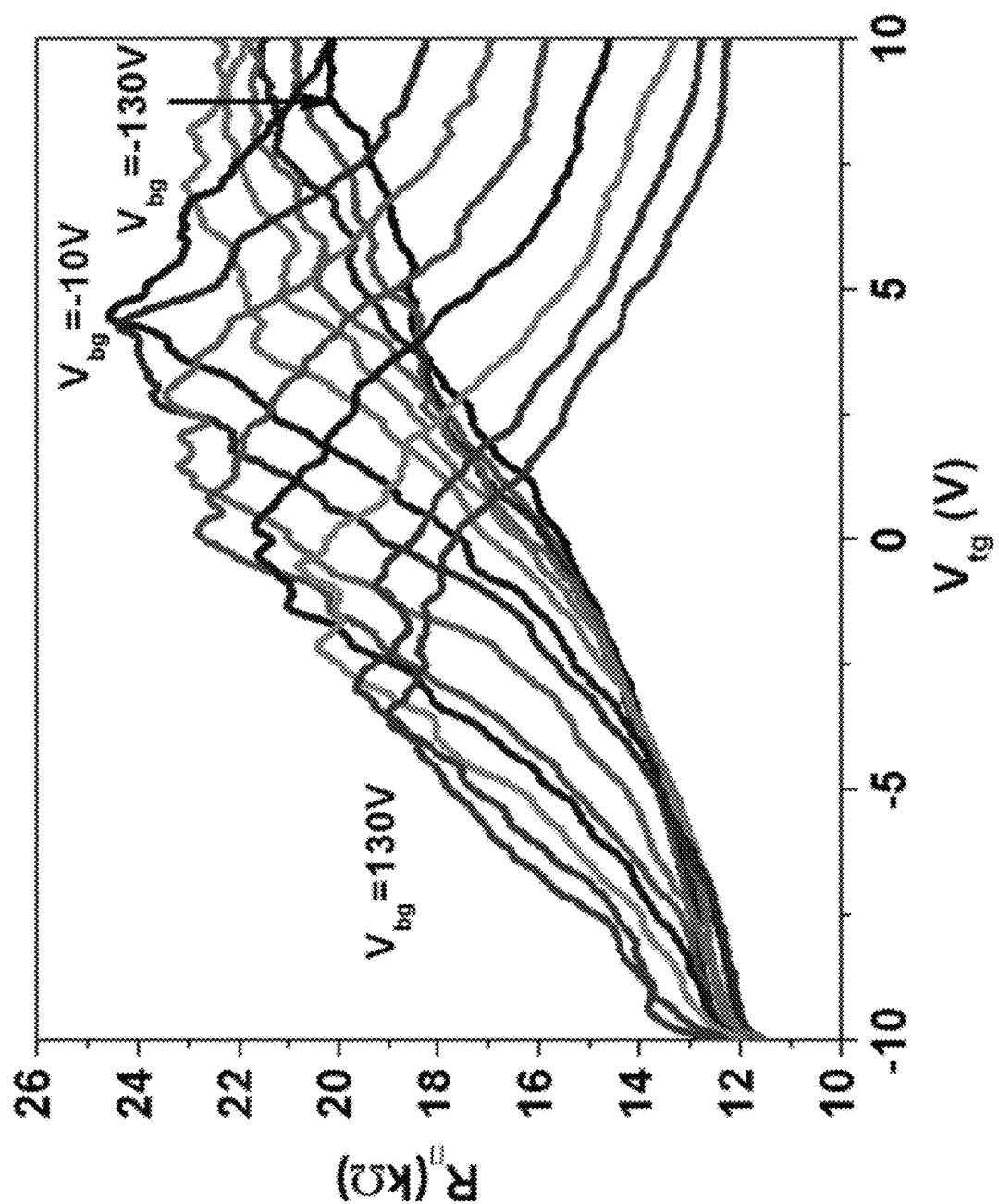
FIG. 8(b) illustrates horizontal section views with $R_\square$ plotted against $V_{tg}$ at fixed $V_{bg}$ from –130 to 130 V with 20V increment.

Additionally, the statistics of bilayer graphene occurrence for 63 (7 row×9 columns) dual-gate devices fabricated across the same film were studied, as shown in FIG. 4(a). 46 out of 63 devices, labeled "A" in the figure, showed bilayer graphene behaviors, characterized by increasing $R_{\square, Dirac}$ at larger fields. Of the remaining devices, two devices "N" contained no graphene pieces, and 14 devices "F" had fabrication defects. One device "T" showed trilayer characteristics with decreasing $R_{\square, Dirac}$ under both more positive and more negative fields (FIGS. 8(a)-(b)). Thus, 46 out of 47 (98%) working devices show bilayer characteristics.

Figure 4B:
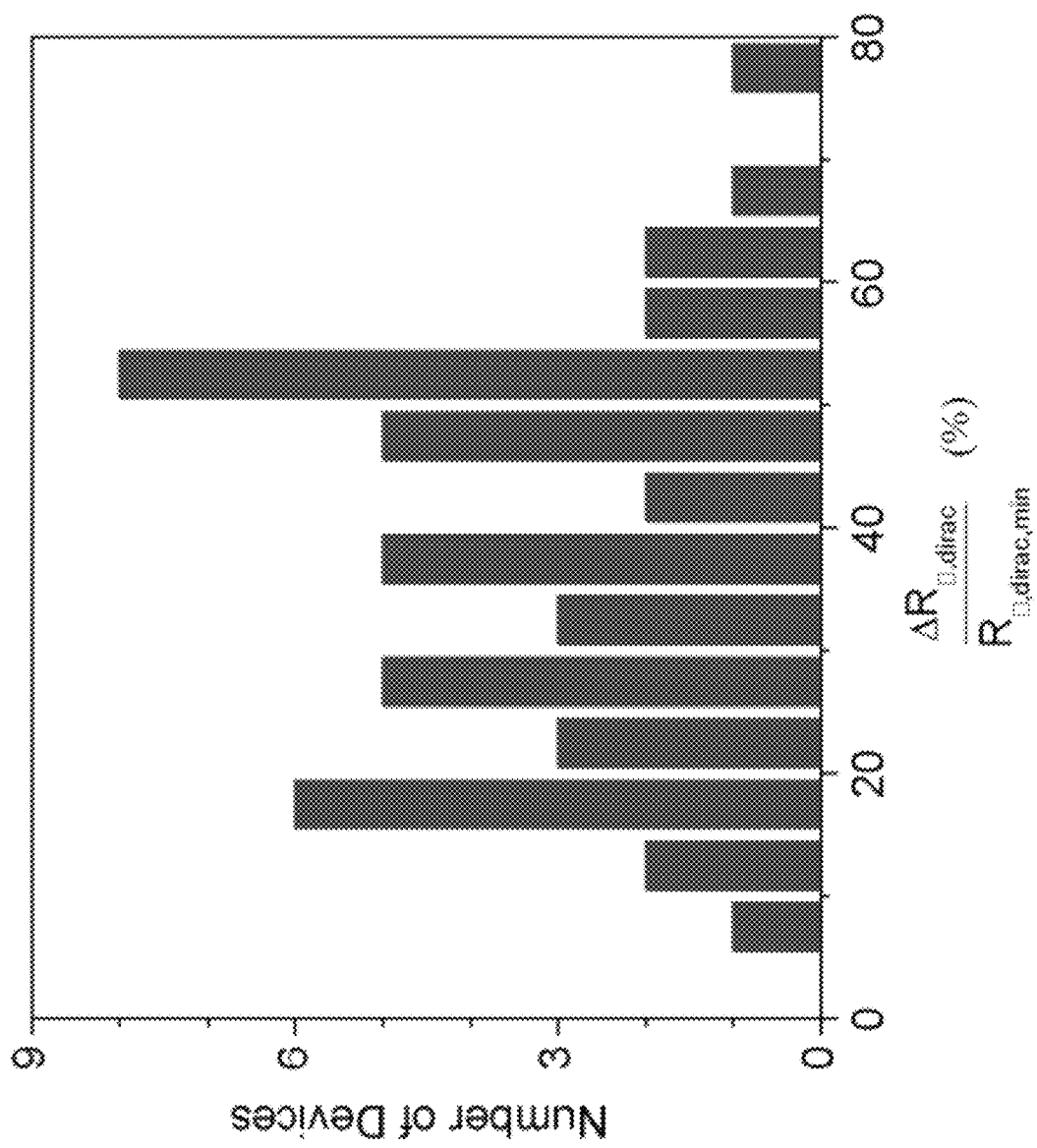
FIG. 4(b) is a histogram of $\Delta R_{\square,dirac}/R_{\square,dirac,min}$ values in percentage for 46 active devices, wherein $\Delta R_{\square,dirac}$ corresponds to a maximum difference in $R_{\square,dirac}$ within $V_{tg}$ of ±10V and $V_{bg}$ of ±120V, and wherein $R_{\square,dirac,min}$ is a minimum peak resistance.

For the bilayer graphene devices, the maximum percentage changes of peak square resistance, $\Delta R_{\square,Dirac}/R_{\square,Dirac,min}$, was also determined. $\Delta R_{\square,Dirac}$ denotes the maximum difference in $R_{\square,Dirac}$ within $V_{tg}$ of ±10V and $V_{bg}$ of ±120V, and $R_{\square,dirac,min}$ is the minimum peak square resistance. A histogram of the percentile changes is shown in FIG. 4(b), with an average peak resistance change of 38% and maximum value of 77%. The smaller-than-expected $R_{\square,Dirac}$ modulation is believed to be caused by defects and unintended impurity doping. High quality gate dielectrics have been shown to improve bilayer graphene device performance dramatically. These electrical measurement results are further indications that the CVD-grown bilayer graphene film is highly uniform and homogeneous.

The size of the uniform multilayer graphene films that can be produced as described herein is limited only by the size of the synthesis apparatus, which can be scaled up to sizes larger than that described below. Integration with existing top-down lithography techniques may bring significant advancement for high performance, light-weight, and transparent graphene electronics and photonics. Furthermore, because the CVD-grown uniform films can be transferred to arbitrary substrates, adopting high-k dielectrics for both top and bottom gates may significantly improve the device performance. For example, only a few voltages applied to the gate electrodes may be able to open up a sizeable bandgap (~250 meV). Previously, it has been suggested that graphene growth on a copper substrate surface is self-limited to a single layer, but the data presented above indicate otherwise.

Figure 9A:
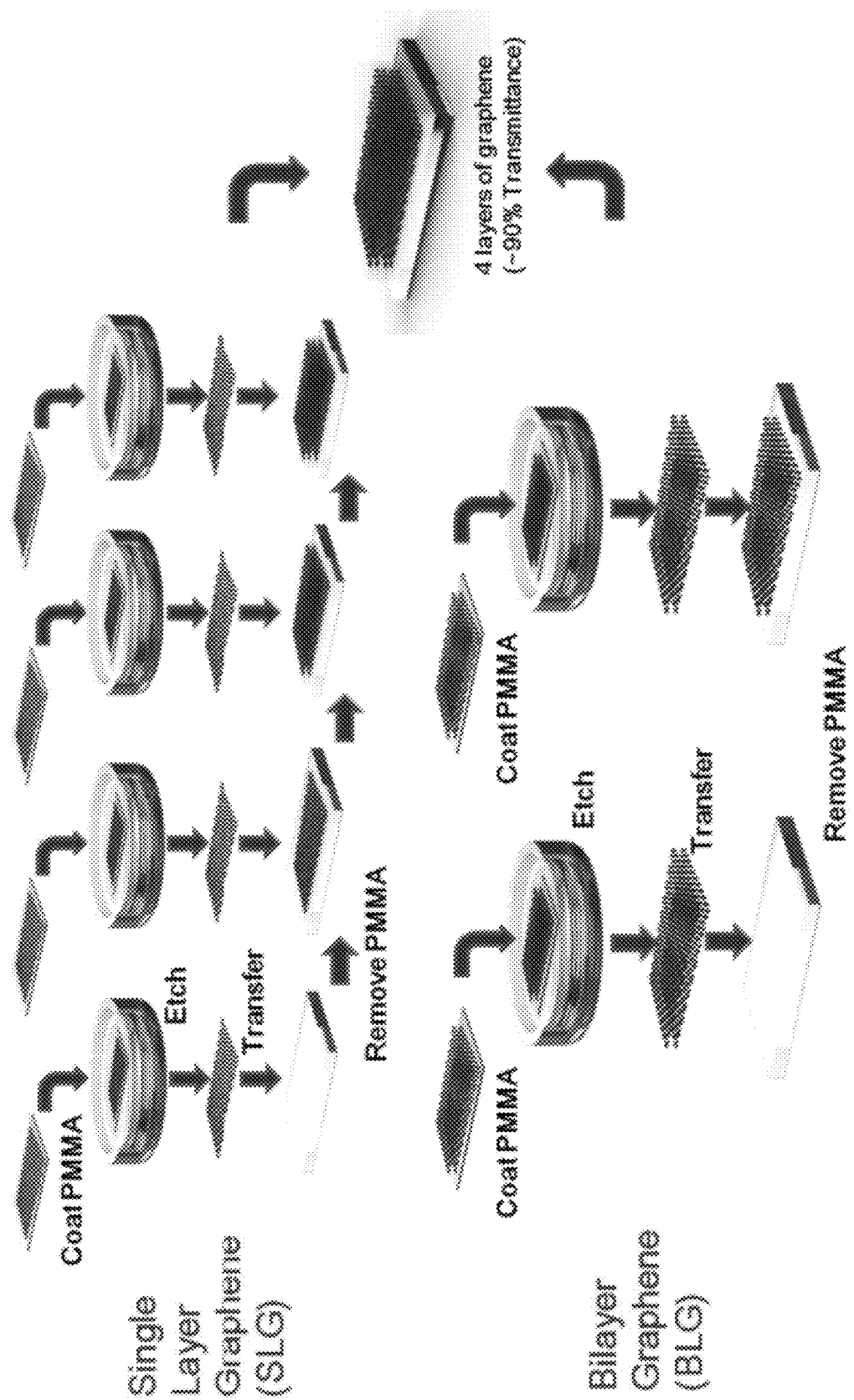
FIG. 9(a) illustrates a comparison between making a multilayer graphene film from stacked SLG sheets and from stacked BLG sheets.

FIG. 9(a) is an illustration showing two different methods of constructing a uniform multilayer graphene sheet having four graphene layers stacked together. Four layers of SLG may be stacked together or two layers of BLG may be stacked together as shown. The BLG may be uniform and produced using a CVD process as described herein. Each method may include multiple steps, including CVD synthesis, coating the synthesized graphene with polymethylmethacrylate (PMMA) or some other etch-resistant coating, etching away the copper or other substrate having a metal surface, transferring the graphene to a target substrate such as a silicon wafer or over an already transferred graphene layer, drying the graphene/coating, and dissolving away or otherwise removing the etch-resistant coating. To form a stack of four graphene layers, four repeating transfer steps are needed when using SLG, and two transfers are needed when using BLG. It is clear that the BLG method significantly reduces the amount of raw materials and time required by reducing the number of transfer process steps by half where the BLG is produced directly via a CVD process as taught herein.

Figure 9B:
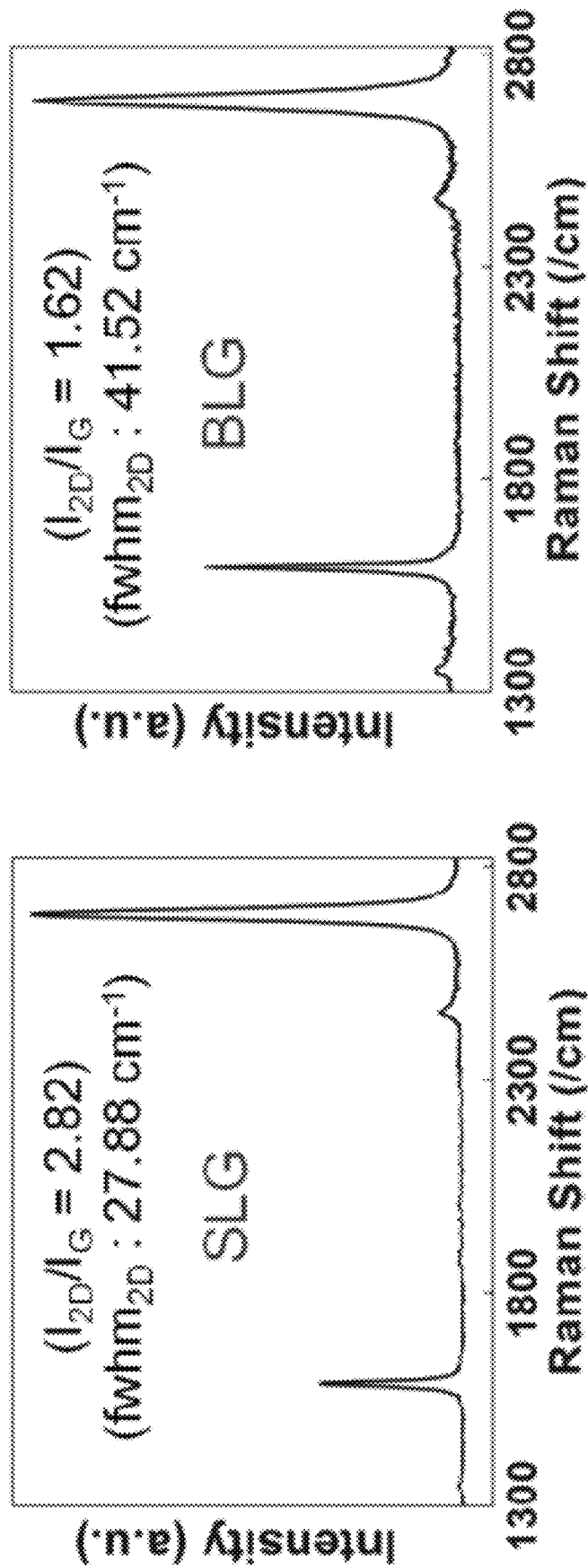
FIG. 9(b) shows Raman spectra taken from CVD-grown SLG (left) and BLG (right) films.

Raman spectra were taken at 10 random spots on the CVD-produced graphene films to verify the number of graphene layers for both SLG and BLG as shown in FIG. 9(b). The mean value of $I_{2D}/I_G$ ratio was measured as 2.8 for SLG and 1.6 for BLG, while the mean value 2D band FWHM 2D was 27.9 cm$^{-1}$ for SLG and 41.5 cm$^{-1}$ for BLG. These Raman spectra values indicate SLG and BLG respectively. The graphene samples were transferred to silicon substrate with 300 nm thick SiO2. Raman spectra were collected using a Renishaw inVia Raman Microscopy system equipped with a 17 mW 633 nm He—Ne laser, an 1800 lines/mm grating, and a 20×SLMPlan objective (0.35 numerical aperture). During data collection, the slit width was kept at 50 µm and the scanning range was between 1300 and 2900 cm$^{-1}$.

Figure 9D:
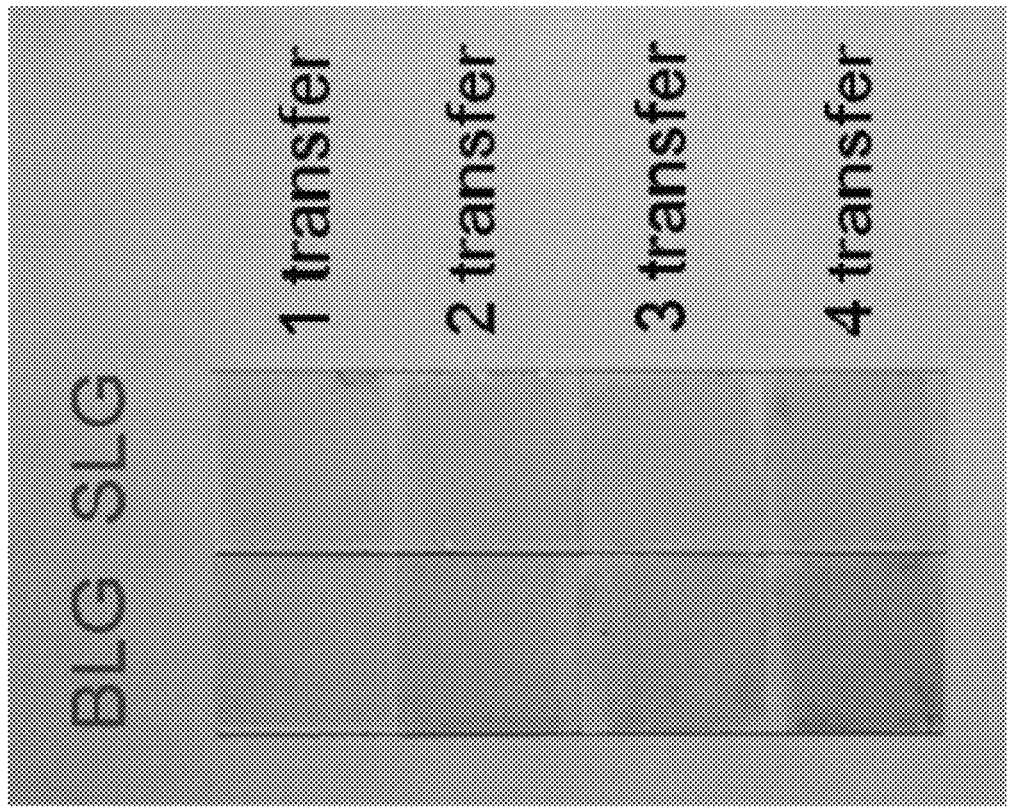
FIGS. 9(c)-9(d) are photographs visually showing different opacity of graphene films having various different numbers of graphene layers, where the number of graphene layers in each labeled sample is the number of transfers for SLG and double the number of transfers for BLG.
Figure 9C:
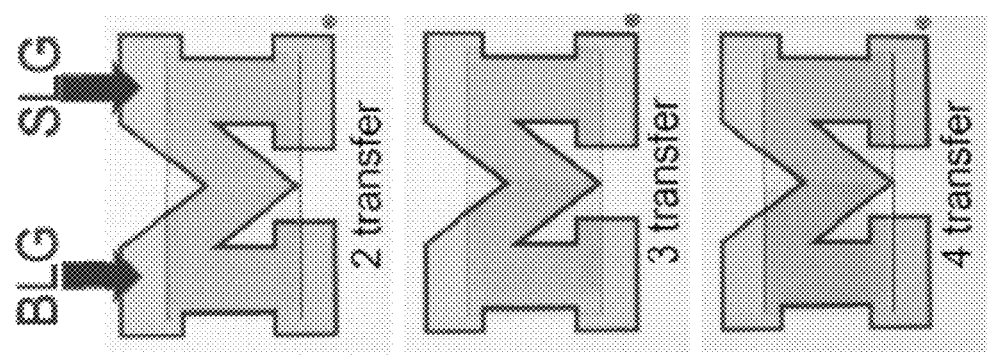

FIG. 9(c) includes photographs that visually demonstrate the differences in the opacity of stacked SLG versus stacked BLG. This is because the difference in the number of graphene layers increase from two to four layers as the number of transfers increase from two to four. From top to bottom, FIG. 9(c) shows BLG on the left and SLG on the right having undergone two, three, and four transfer steps, respectively, so that from top to bottom in the Figure, the BLG sheets include 4, 6, and 8 layers of graphene, and the SLG sheets include 2, 3, and 4 layers of graphene. FIG. 9(d) shows direct optical comparison of both SLG stacks and BLG stacks without background color.

Figure 10A:
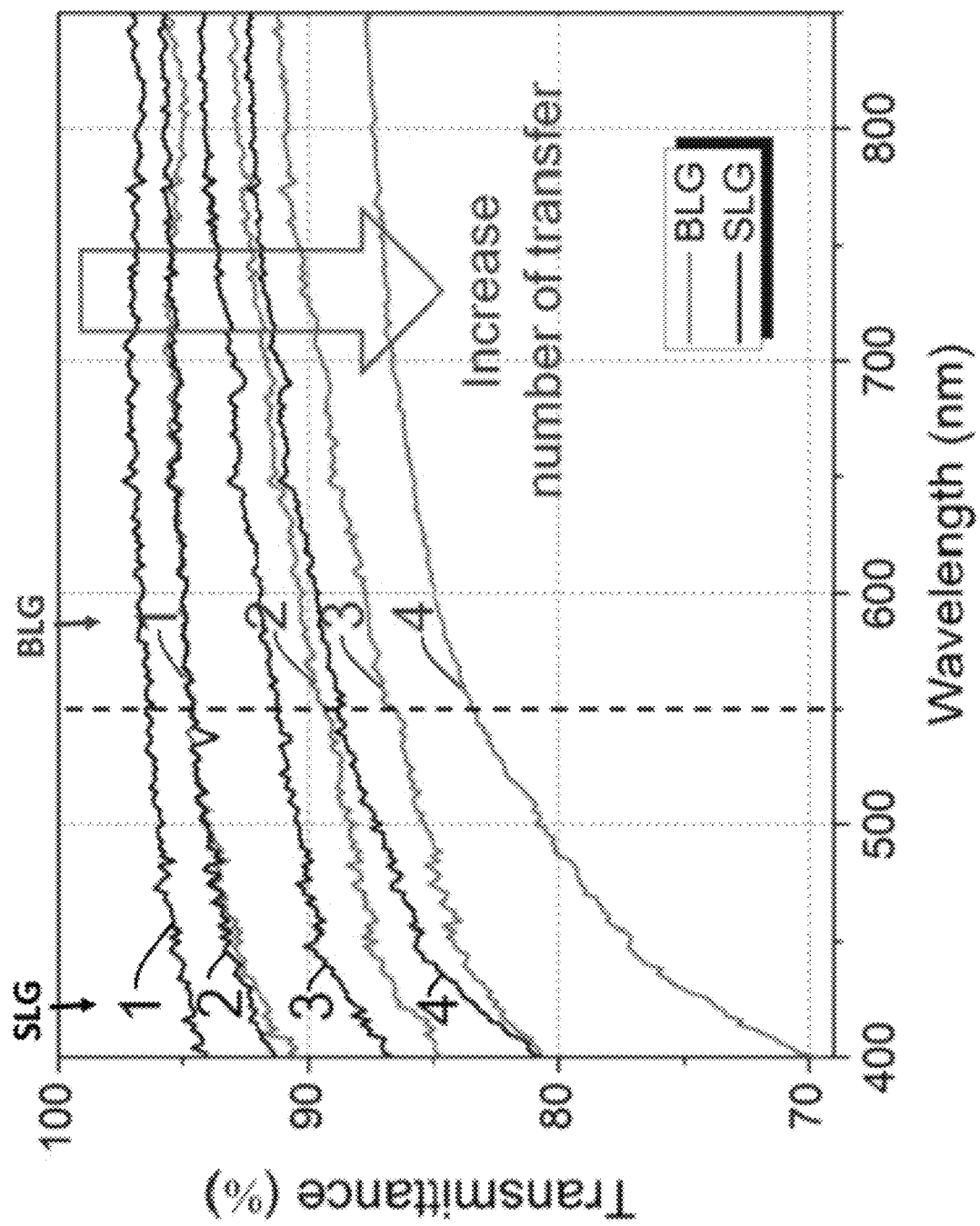
FIG. 10(a) is a plot of optical transmittance as a function of wavelength for 1-, 2-, 3-, and 4-transfer SLG and BLG films, where the number near each measurement line indicates the number of transfers.

The transmittance (T) of the stacked SLG films and the stacked BLG films were also measured on glass substrates for comparison, resulting in the graph shown in FIG. 10(a). The transmittance of both stacked SLG and BLG films drops as the number of transfer steps increases. Notably, stacked BLG after one transfer (two layers of graphene) shows similar T as stacked SLG after two transfers (two layers of graphene). Also, stacked BLG after two transfers (four layers of graphene) shows similar T as stacked SLG after four transfers (four layers of graphene). For quantitative comparison, the 550 nm wavelength transmittance values of stacked SLG from 1, 2, 3, and 4 transfers were measured to be 96.5%, 94.6%, 91.3%, and 89.0% respectively. The transmittance values of stacked BLG from 1, 2, 3, and 4 transfers were 94.7%, 89.3%, 86.6%, and 83.0% respectively. This indicates that the transmittance is similar for multilayer graphene whether it is produced from multiple sheets of SLG or from half the number of sheets of uniform BLG. The transmittance spectrum decreases as it nears the ultraviolet region due to exciton-shifted Van Hove singularity in the graphene density of states. It is noted that the downward shift in transmittance near the high energy (short wavelength) region is more significant as the number of stacked layers increases. This has been observed and may be due to residue trapped between layers.

Figure 10B:
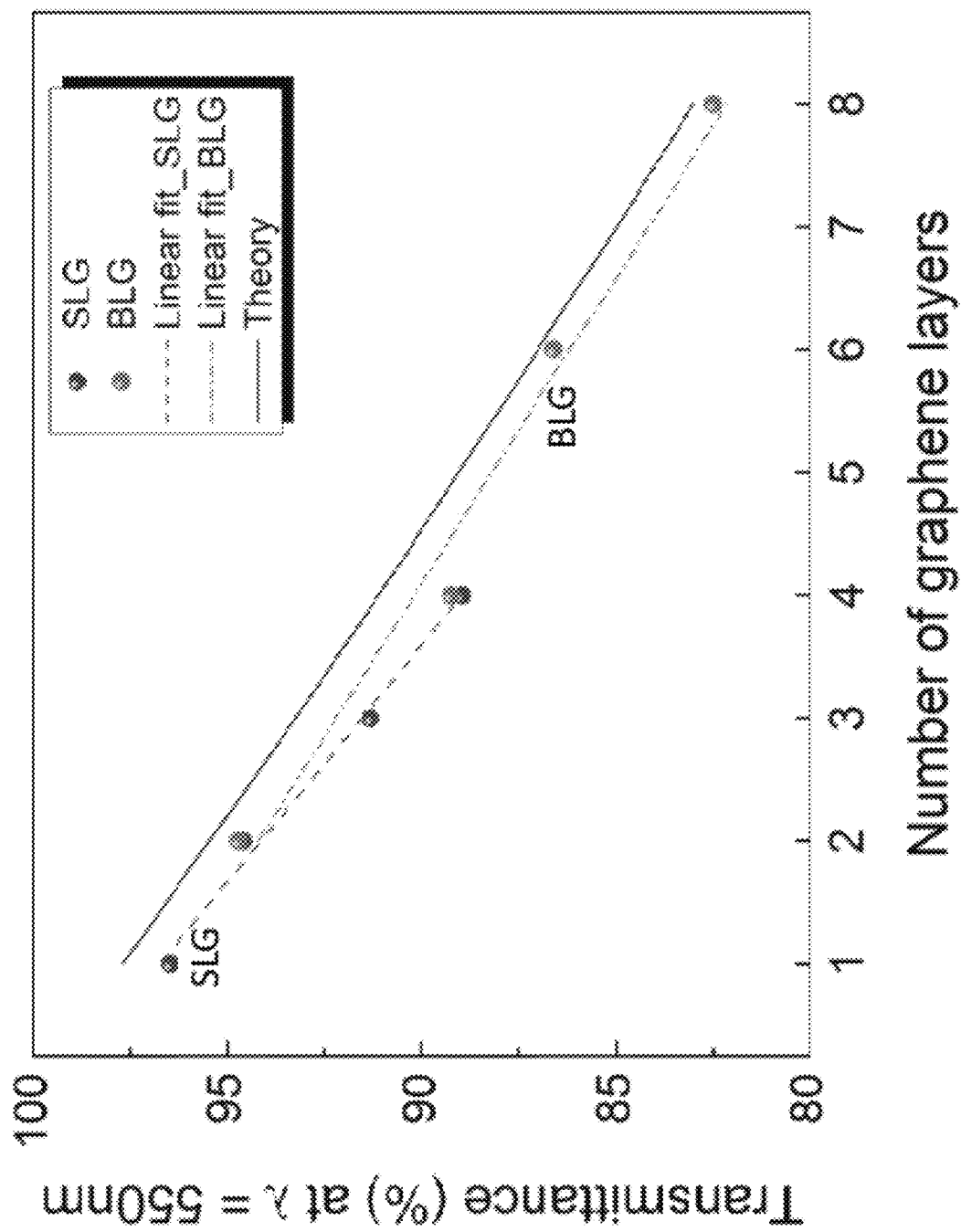
FIG. 10(b) is a plot of transmittance at λ=550 nm as a function of number of graphene layers for stacked SLG and BLG films.

FIG. 10(b) shows transmittance values at 550 nm as a function of total graphene layer numbers, and compares them with theoretical values. It has been previously shown that transmittance of graphene is defined by fine structure constant $\alpha \approx 0.0073$, and the transmittance of a single graphene layer can be expressed as $T \approx 1-\pi\alpha \approx 97.7 \pm 0.1\%$. Thus, the transmittance of multiple layers can be expressed as $T_n=(1-\pi\alpha)^n$ where n is the number of layers. The plots of FIG. 10(b) indicate that the increases in opacity of both stacked BLG and stacked SLG are close to the theoretical value. The offset of 1%-2% from the theory is noted and likely due to small amounts of polymer residue (e.g. PMMA) that may have been trapped between the sandwiched individual SLG or BLG sheets. It is typical to observe slightly higher opacity in multiple stacked samples.

The transmittance measurement setup included a monochromator (Acton SP2300 triple grating monochromator/spectrograph, Princeton Instruments) coupled with a 250 W tungsten halogen lamp (Hamatsu), a collimator, and a photodetector. An optical filter was used to eliminate higher order diffraction from monochromator. An iris was used to prevent the photodector from absorbing the scattered light from the glass substrate. Optical power measurements were carried out using a 1928-C power meter (Newport) coupled to a UV-enhanced 918UV Si photodetector (Newport). A blank glass substrate was used as a reference for substraction.

Figure 10C:
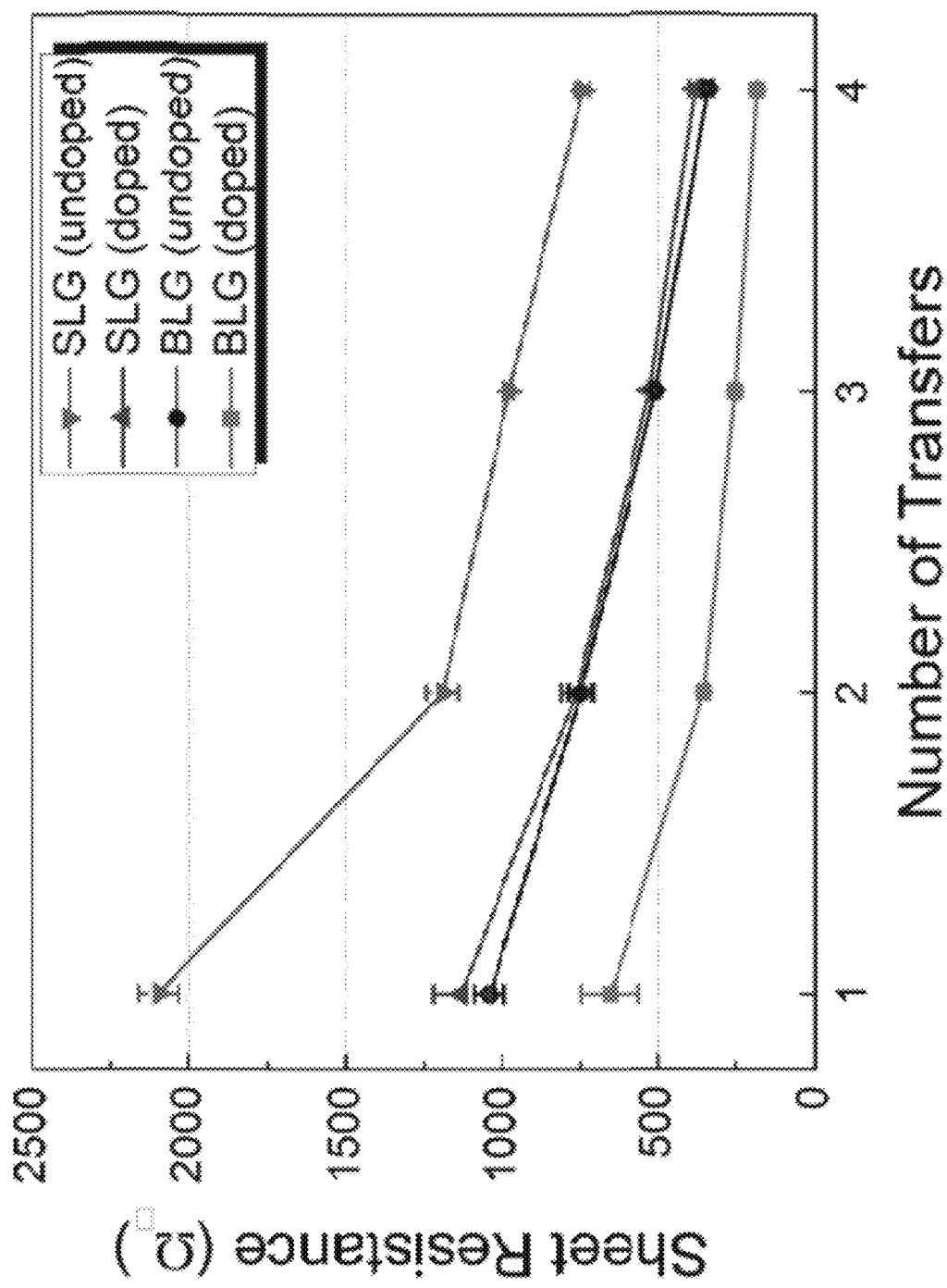
FIG. 10(c) is a plot of sheet resistance of both undoped and doped stacked SLG and stacked BLG films with different numbers of transfer steps.

As shown in FIG. 10(c), the sheet resistance (R□) values were characterized using the four probe method for both undoped and nitric acid-doped films having both stacked SLG and stacked BLG constructions. P-doped films were produced by immersing the stacked SLG and stacked BLG films in 47.6% nitric acid for at least 12 hours after transferring all of the individual sheets to the target substrate. Each data point was taken from 10 different regions on each sample and standard deviation values are expressed with error bars. As the number of transfer steps increases, the sheet resistance decreases for both doped and undoped samples. Sheet resistance also drops roughly by a factor of two after layer-by-layer nitric acid doping. It is noted that the sheet resistance values of stacked BLG having one and two transfers are similar to that of stacked SLG having two and four transfers.

Figure 10D:
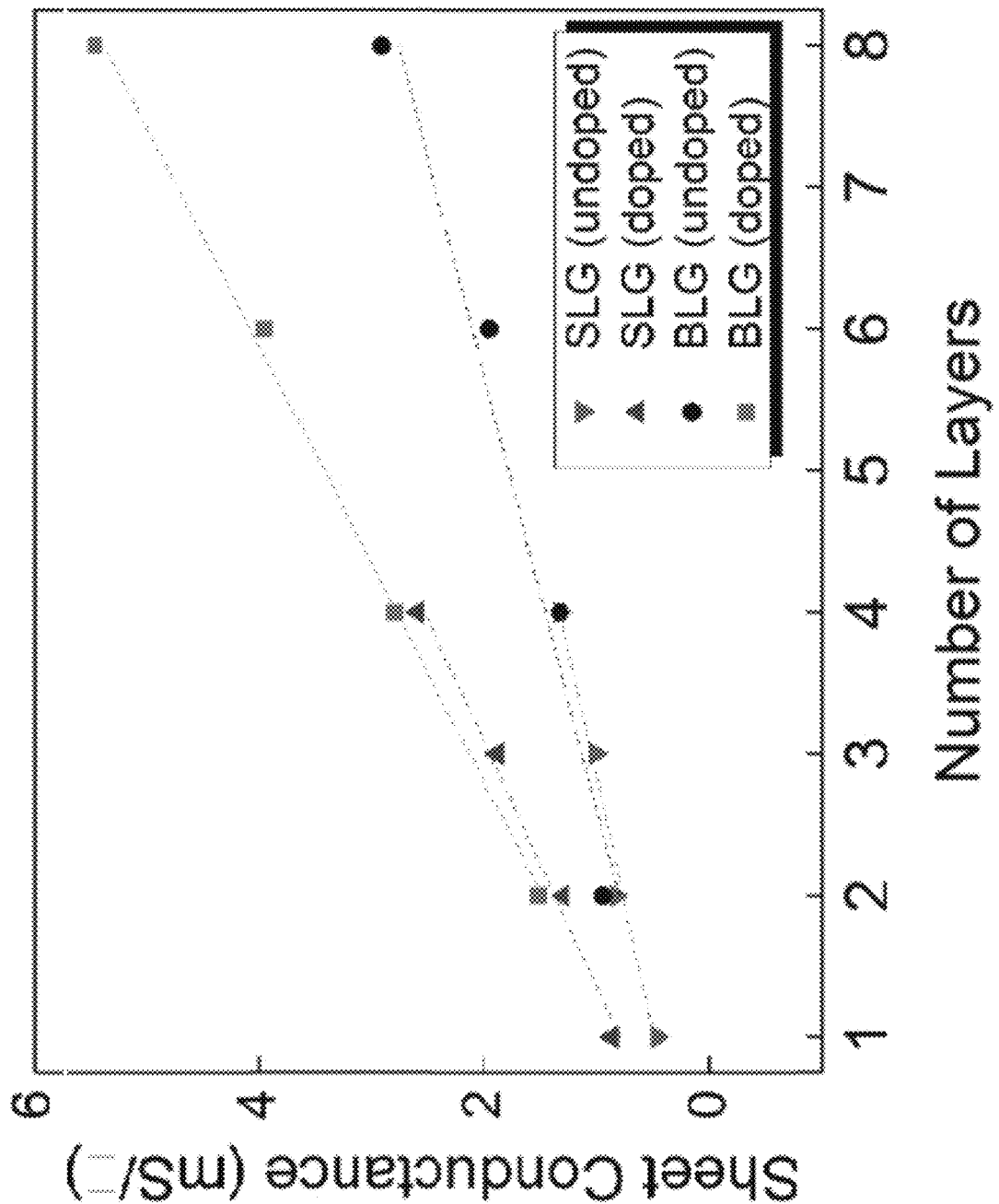
FIG. 10(d) is a plot of sheet conductance of both undoped and doped stacked SLG and stacked BLG films as a function of number of graphene layers.

The total resistance of multilayer graphene includes component of both in-plane sheet resistance of individual layers and interlayer resistance between layers. High interlayer resistance may cause most of the current to flow only at the top most layer or the layer where the voltage is applied. To investigate the effect of interlayer resistance in multilayer graphene sheets, sheet conductance G□ was plotted versus the number of graphene layers and is shown in FIG. 10(d). G□ increases linearly with increasing graphene layers for all samples, suggesting that interlayer resistance is negligible and all layers contribute to current flow. Linear fits yielded 0.278 mS□/layer for undoped and stacked SLG film, 0.325 mS□/layer for undoped and stacked BLG film, 0.574 mS□/layer for doped and stacked SLG film, and 0.649 mS□/layer for doped and stacked BLG film. The consistent sheet conductance per graphene layer found in SLG and BLG stacks, both doped and undoped, indicates that uniform BLG can achieve the same performance as SLG while achieving some of the above-described advantages.

Figure 10E:
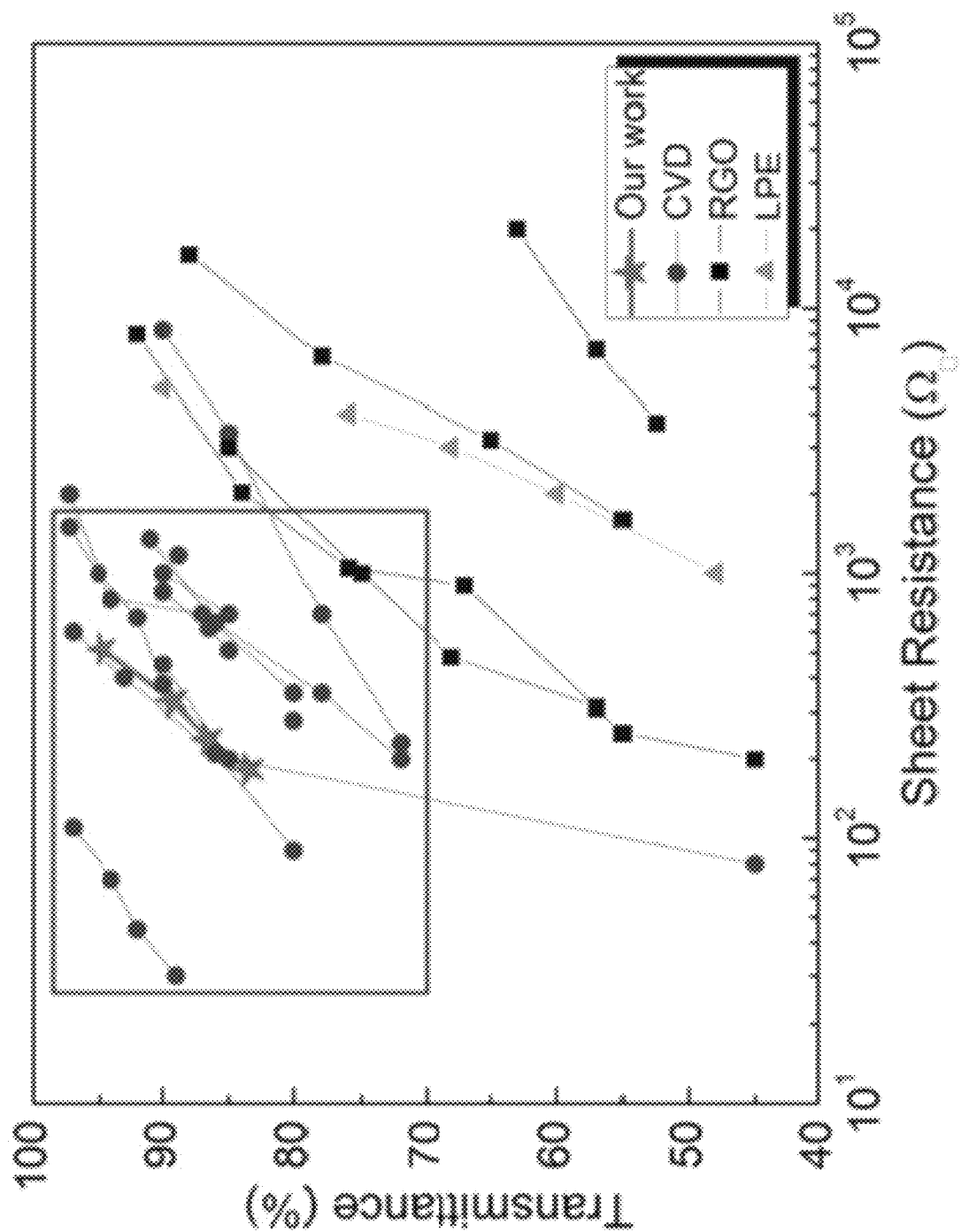
FIG. 10(e) is a plot of optical transmittance versus sheet resistance for graphene-based transparent conductors grouped according to production methods.
Figure 10F:
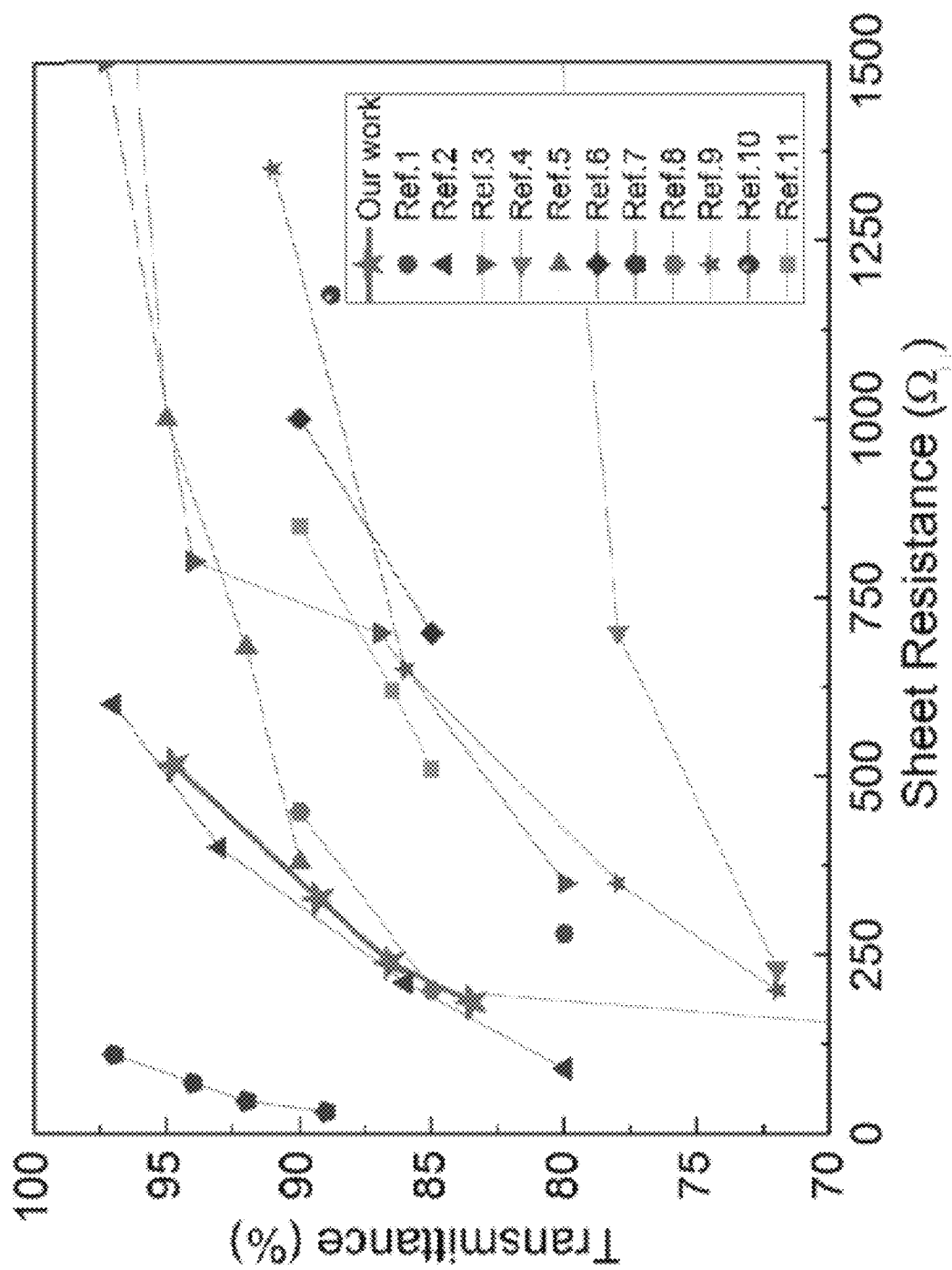
FIG. 10(f) is the inset portion of the plot of FIG. 10(e) with the sheet resistance changed to linear scale.

Data from prior graphene-based transparent conductors in terms of transmittance and sheet resistance is summarized in FIGS. 10(e) and 10(f). In FIG. 10(e), the reports are shown based on different production methods. The quality of transparent conductors is highest in the plot of FIG. 10(e) in the upper left portion of the plot where optical transmittance is higher and sheet resistance is lower. The star-shaped points on the plot indicate resistance CVD-produced uniform multilayer graphene produced by the methods disclosed herein, and specifically uniform BLG. As shown, CVD-grown graphene data is clustered in the upper right portion of the plot (circular data points) and is generally better than the data collected from graphene sheets produced by liquid-based synthesis methods, such as reduction of graphene oxide (RGO—squares on plot) or liquid phase exfoliation (LPE—triangles on plot). FIG. 10(f) shows only the CVD/nitric acid dopant data from FIG. 10(e). The BLG produced by the methods presented herein is shown to be of comparable or better quality than other methods that stack multiple sheets of SLG together or that produce multilayer graphene with previous CVD techniques where uniformity is not present in the film.

Figure 11A:
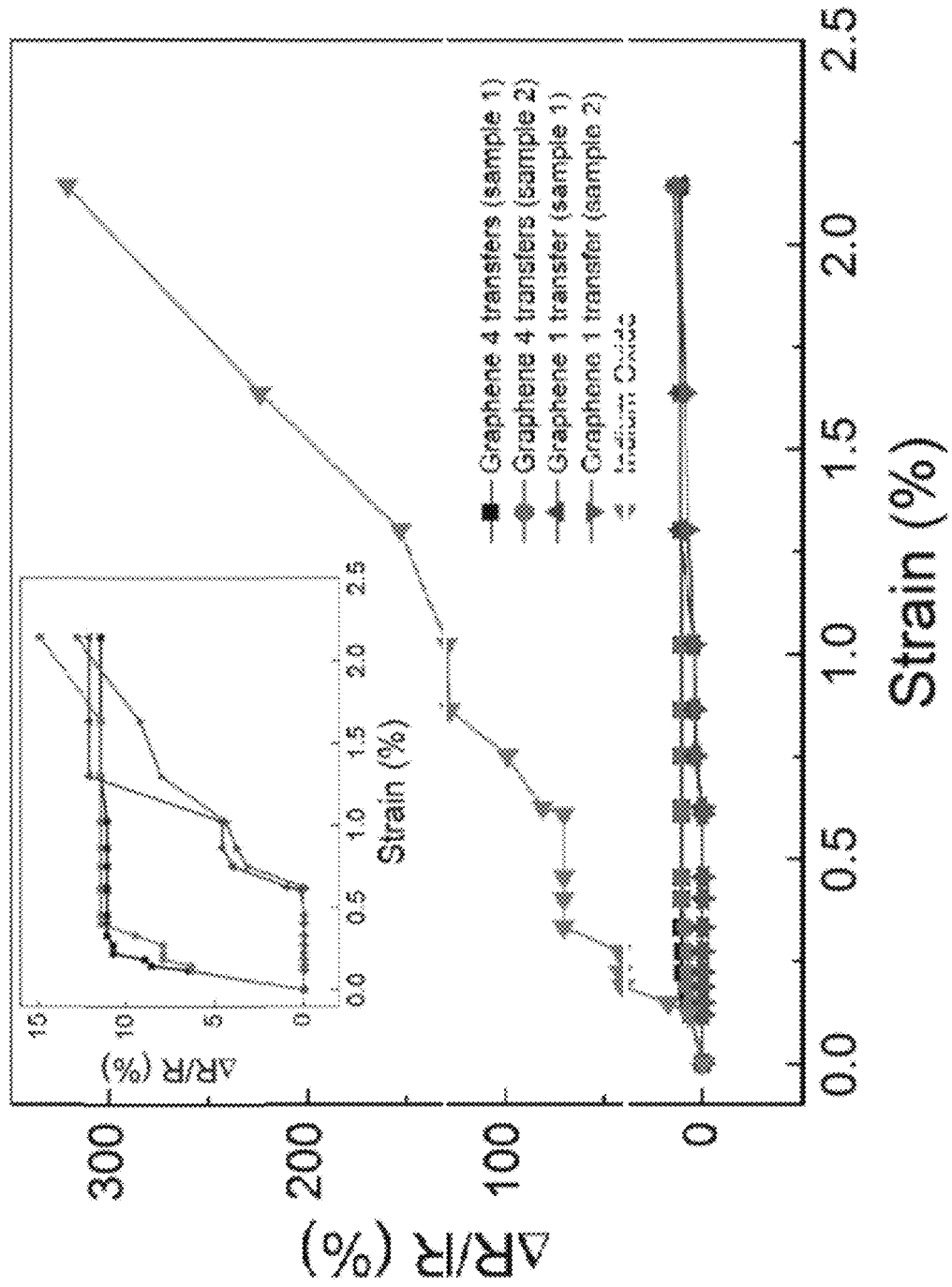
FIG. 11(a) includes photographs of graphene film on flexible PET substrate (left), and a bent substrate under electrical measurement (right)

To test the sheet resistance of stacked BLG under mechanical deformation, BLG films were transferred onto 200 μm thick polyethyleneterephthalate (PET) flexible substrates and patterned with gold electrodes for four-probe measurement as shown in FIG. 11(a). A Miller FPP-5000 4-Point Probe Resistivity Meter was used to measure sheet resistance of the stacked graphene sheets. To measure resistivity of stacked graphene sheets under bending conditions, the sheets were first transferred onto PET substrates. Indium oxide samples on 200 μm thick PET were purchased for comparison (Delta Technology Limited, PF-65IN-1502). Subsequent metal patterning and graphene patterning were done to allow four probe Van der Pauw method while the substrate was bent. The current and voltage difference was measured using a DAQ (National Instruments) in series with a current pre-amplifier (Ithaco, DL instruments 1211).

Figure 11B:
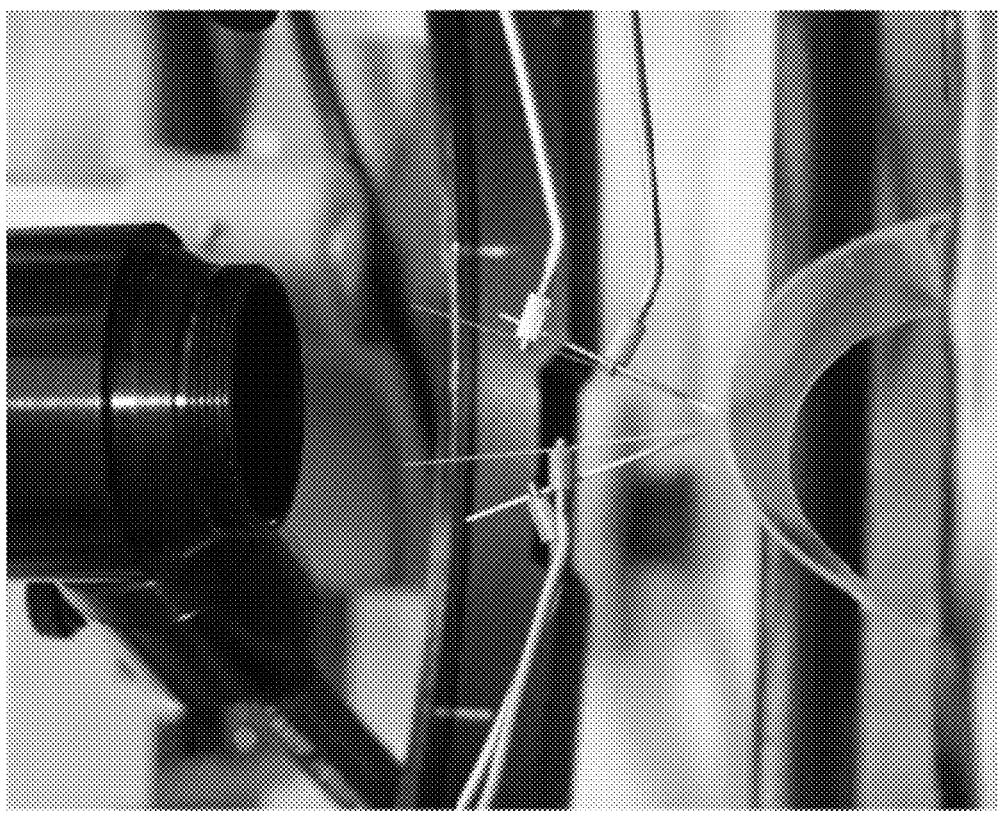
FIG. 11(b) is a plot of change in sheet resistance of graphene films and indium oxide films on 200 μm thick PET substrate as a function of strain.
Figure 11B:
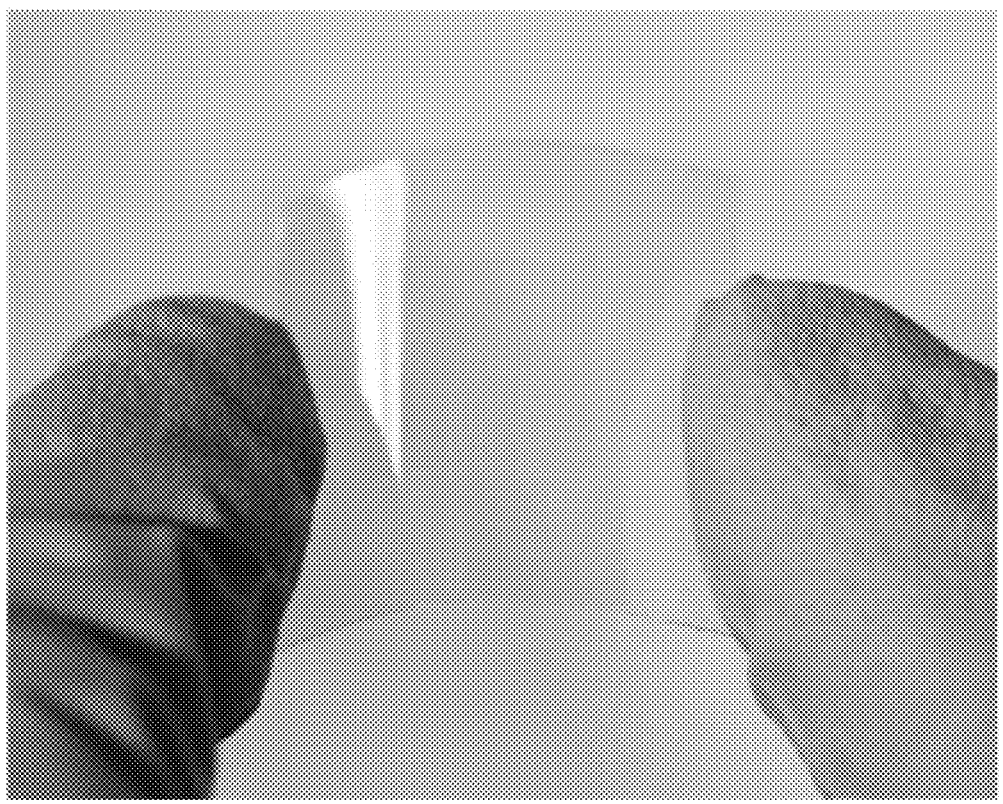

Two films of stacked BLG having one-transfer and two films of stacked BLG having four transfers were tested and compared with commercially available indium oxide on PET substrates under bending conditions. FIG. 11(b) shows relative changes in sheet resistance versus strain due to bending. For purposes of the plot, the radius of curvature was converted to the strain using the equation $\varepsilon=d/2r$ where $\varepsilon$ is surface strain, d is substrate thickness, and r is radius of curvature. At 2.14% strain, the sheet resistance of the indium oxide sample increased by 321%. The sheet resistance of the graphene films increase by an amount ranging from 10 to 15%. The indium oxide sample exhibits sharp changes in sheet resistance under strain due to its brittle nature while graphene films are relatively flexible and robust when subjected to bending. The inset of FIG. 11(b) is a detailed comparison between stacked BLG having one transfer and stacked BLG having four transfers. It is noted that the increase in sheet resistance of the stacked BLG having four transfers occurs at a lower strain than with the BLG having a single transfer. This may be due to shear stress acting between individual BLG sheets in the overall film to disrupt the interface state between graphene layers. Bending of the substrate may increase the inter-layer resistance, thus leading to the earlier increase in sheet resistance. However, the reasons for this behavior are not fully known or understood.

Figure 12:
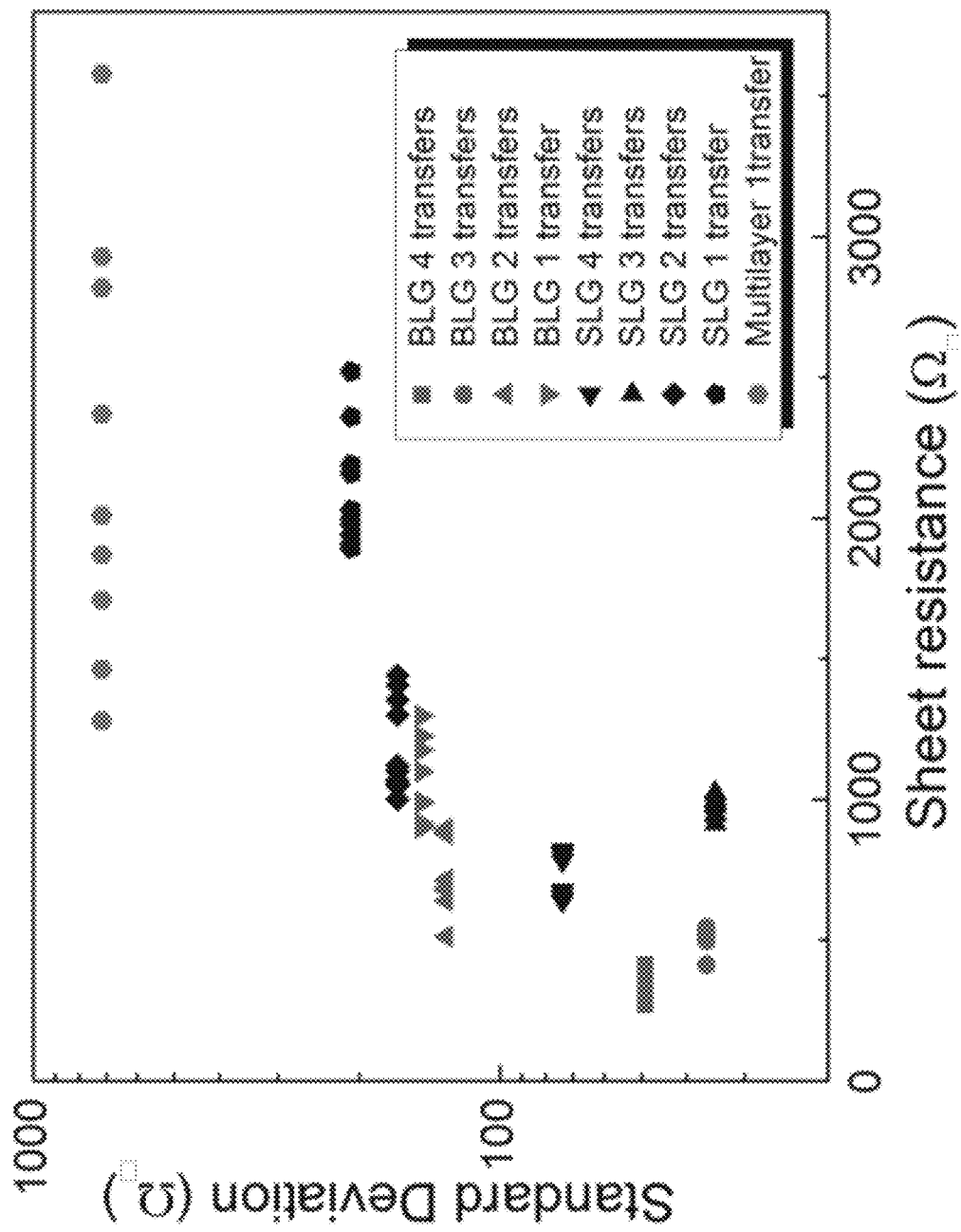
FIG. 12 is a plot showing the distribution of sheet resistance and its standard deviation values for stacked SLG films, stacked BLG films, and APCVD a MLG sample. 10 measurements were taken on different areas of each sample.

Uniformity of multilayer graphene films made from stacked individual sheets of SLG and BLG was also evaluated. Ten measurement points were taken from different areas of each film, and their standard deviations are plotted in FIG. 12. Sheet resistance values for a multilayer graphene sample produced by APCVD are also included in the plot (labeled as MLG). Actual values of sheet resistance are plotted for facile observation of the distribution. Stacked BLG and stacked SLG samples show similar distributions and standard deviations with respect to sheet resistance. It is noted that the standard deviation values become lower as the number of layers in the stacked graphene films increases. This may be contributed to the increased number of graphene layers that can act as channels to negate certain high resistivity areas (e.g. wrinkles or defects) that may reside on one of the layer in the stacked film. The MLG sample shows high standard deviation indicating a higher level of non-uniformity in sheet resistance across the sample area. This indicates the problematic non-uniformity in multilayer graphene produced by other CVD techniques.

Stacked BLG films produced by the above-described CVD methods thus offer better uniformity than MLG and greatly reduced fabrication complexity when compared stacked SLG films. Stacking uniform BLG sheets to arrive at a multilayer graphene film additionally offers the ability to be doped layer-by-layer like SLG, but unlike MLG produced by APCVD. Stacked SLG sheets require twice as many graphene transfer steps as stacked uniform BLG sheets to arrive at the same number of graphene layers, and the data presented above indicates that properties such as optical transmittance and sheet resistance depend on the total number of graphene layers, whether the layers were provided as BLG sheets or SLG sheets. With twice the number of transfer steps, making a multilayer graphene sheet from uniform BLG sheets cuts in half the amount of material waste due to metal etching as well as processing time. Additionally, transferring a large area of graphene such as macro scale or wafer scale graphene or even larger (e.g., from 0.1 to 1.0 meter) is a delicate process that can jeopardize the overall quality of graphene, thus making minimization of the total number of transfer steps favorable.

Experimental Sample Preparation

A 25 µm thick copper foil (99.8%, Alfa Aesar) was placed into an inner quartz tube reaction chamber inside a three-inch horizontal tube furnace of a commercial CVD system (First Nano EasyTube 3000). The system was purged with argon gas and evacuated to a pressure of about 0.1 Torr. The chamber was then heated to 1000° C. in an $H_2$ (100 sccm) environment at a pressure of about 0.35 Torr. When a chamber temperature of 1000° C. was reached, 70 sccm of $CH_4$ was flowed through the chamber for 15 minutes at a pressure of 0.45 Torr. The sample was then cooled slowly to room temperature with a feedback loop to control the cooling rate. The pressure was maintained at 0.5 Torr with 100 sccm of argon flowing. A time vs. temperature plot from the CVD growth process is shown in FIG. 5.

Two different methods were used to transfer the produced uniform multilayer graphene from copper foil substrate to $SiO_2$ substrates. The first method utilized thermal release tape (Nitto Denko) to transfer the graphene from the copper foil. The tape was applied to the graphene surface and a force of 6.25 $N/cm^2$ was applied to the copper/graphene/tape stack for 10 minutes using a EVG EV520IS wafer bonder. The opposite side of the substrate was exposed to $O_2$ plasma for 30 seconds to remove the graphene on that side. The substrate was etched away using an iron (III) nitrate (Sigma Aldrich) solution (0.05 g/ml) for 12 hours. A 4-inch silicon wafer with thermally grown $SiO_2$ was precleaned with nP12 nanoPREP using plasma power of 500 W for 40 seconds to modify the surface energy and produce a hydrophilic surface. The tape and graphene stack was transferred to the pre-cleaned $SiO_2$ wafer and a force of 12.5$N/cm^2$ was applied for 10 minutes. The substrate was then heated to 120° C. to overcome the adhesion of the thermal release tape. The tape was then peeled off and the adhesive residue was removed with warm acetone.

Polymethylmethacrylate (PMMA) film may be used in another method to transfer graphene. This method does not require a bonding tool but the edge portion of the graphene film may be rough due to uneven thickness of spin-coated PMMA at the edge. In this method, the growth side of the CVD graphene sample was coated with 950PMMA A6 (Microchem) resist and cured at 180° C. for 5 minutes. The other side of the substrate was exposed to $O_2$ plasma for 30 seconds to remove the graphene on that side. The sample was then left in iron (III) nitrate (Sigma Aldrich) solution (0.05 g/ml) for at least 12 hours to completely dissolve away the copper layer. The sample was transferred onto a silicon substrate with a thermal oxide layer. The PMMA coating was removed with acetone and the substrate was rinsed several times. Raman spectroscopy as well as optical microscope were used to characterize the graphene films from all transfers, and electrical transport measurement was done with samples transferred by the PMMA method.

For the above-described electrical testing, graphene devices were fabricated according to the following process. After the multilayer graphene was transferred onto $SiO_2$/Si substrate, Ti/Au (5 nm/100 nm) was deposited to form the source/drain electrodes. Bilayer graphene films were then patterned into 1 µm×1 µm, 1 µm×2 µm, and 2 µm×2 µm pieces using conventional lithography and oxygen plasma etching. After 40 nm of $Al_2O_3$ was deposited as the top gate dielectric by atomic layer deposition (ALD), top gates were patterned and the metals were evaporated (Ti/Au: 5 nm/100 nm). It is noted that the adhesion between metal electrodes and graphene was not perfect, as some metal peeled off. Gate leakage/breakdown at high field was also observed for some devices. These devices are regarded as fabrication defects, as described in conjunction with FIG. 4(a).

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method of directly synthesizing a uniform multilayer graphene film by chemical vapor deposition, the method comprising the steps of:
    (a) placing a substrate in a reaction chamber of a furnace;
    (b) increasing the temperature in the reaction chamber to a desired level; and
    (c) after the temperature in the reaction chamber reaches the desired level, flowing a reaction gas in the reaction chamber under at least one of the following conditions: without $H_2$ gas, or at a pressure in the reaction chamber of less than 0.5 Torr,
    wherein the uniform multilayer graphene film is uniform bilayer graphene in which a major and continuous portion of the film has exactly and only two graphene layers when the chemical vapor deposition ends.

2. The method of claim 1, wherein the substrate includes a transition metal surface.

3. The method of claim 1, wherein the desired level of the temperature in the reaction chamber is about 1000° C.

4. The method of claim 1, wherein flowing the reaction gas in the reaction chamber occurs for about fifteen minutes in step (c).

5. The method of claim 1, further comprising the steps of:
    flowing $H_2$ gas in the reaction chamber prior to step (c); and
    thereafter ceasing the flow of $H_2$ gas prior to step (c).

6. The method of claim 1, wherein step (c) is carried out at a pressure in the reaction chamber of less than about 0.5 Torr.

7. The method of claim 1, further comprising the step of:
    decreasing the temperature in the reaction chamber at a controlled rate of less than about 100° C./min after step (c).

8. A method of producing multilayer graphene, comprising the steps of:
(a) placing a substrate having a metal surface in a reaction chamber of a furnace;
(b) flowing $H_2$ gas in the reaction chamber;
(c) increasing the temperature in the reaction chamber to a desired level;
(d) after the temperature in the reaction chamber reaches the desired level, ceasing flow of the $H_2$ gas, and flowing reaction gas in the reaction chamber for a desired time, wherein the reaction gas begins flowing in the reaction chamber after step (c) and after the flow of $H_2$ gas is ceased; and
(e) after the desired time, decreasing the temperature in the reaction chamber at a controlled rate.

9. The method of claim 8, wherein the desired level of the temperature in the reaction chamber is about 1000° C. in steps (c) and (d), and the desired time is about fifteen minutes in step (d).

10. The method of claim 8, wherein step (d) is carried out at a pressure in the reaction chamber of less than 0.5 Torr and the controlled rate of step (e) is less than 100° C./min.

11. The method of claim 8, further comprising:
flowing the $H_2$ gas at a flow rate of about 100 standard cc/min at a reaction chamber pressure of about 0.35 Torr during step (b);
maintaining the flow rate of the $H_2$ gas and the reaction chamber pressure of step (b) and increasing the temperature in the reaction chamber to about 1000° C. in about 25 minutes during step (c);
maintaining the temperature in the reaction chamber at about 1000° C. and flowing the reaction gas at a flow rate of about 70 standard cc/min at a reaction chamber pressure of about 0.45 Torr for about 15 minutes during step (d); and
decreasing the temperature at a controlled rate of about 18° C. during step (e).

12. A method of producing multilayer graphene, comprising the steps of:
(a) placing a substrate having a metal surface in a reaction chamber of a furnace;
(b) evacuating the reaction chamber;
(c) purging the reaction chamber with a working gas;
(d) flowing $H_2$ gas in the reaction chamber after step (c);
(e) increasing the temperature in the reaction chamber to a desired level during step (d);
(f) after the temperature in the reaction chamber reaches the desired level, ceasing flow of the $H_2$ gas so that the reaction chamber is free of $H_2$ gas, and flowing reaction gas in the reaction chamber after the reaction chamber is free of $H_2$ gas at a pressure in the reaction chamber of less than 0.5 Torr; and
(g) thereafter decreasing the temperature in the reaction chamber at a rate of less than 100° C./min.

13. A method of making a multilayer graphene film, comprising the steps of:
(a) synthesizing uniform multilayer graphene by chemical vapor deposition;
(b) providing a uniform graphene sheet having at least one layer of graphene, wherein the uniform graphene sheet is synthesized separately from the uniform multilayer graphene synthesized in step (a); and
(c) stacking the uniform multilayer graphene of step (a) together with the uniform graphene sheet of step (b), wherein step (b) comprises chemical vapor deposition, wherein step (b) comprises synthesizing uniform multilayer graphene, and
wherein at least one of steps (a) or (b) comprises directly synthesizing uniform bilayer graphene by chemical vapor deposition, wherein.

14. The method of claim 13, wherein both of steps (a) and (b) comprise synthesizing bilayer graphene.

15. The method of claim 14, wherein step (c) comprises a transfer process that includes transferring the graphene from at least one of steps (a) or (b) from a polymer film to the graphene from the other of steps (a) or (b).

16. The method of claim 13, further comprising the step of doping the graphene of both of steps (a) and (b) prior to step (c).

17. The method of claim 1, wherein the uniform multilayer graphene film is synthesized on a substrate.

18. The method of claim 1, further comprising the step of forming a semiconductor device that includes the uniform bilayer graphene.

19. The method of claim 1, further comprising the step of forming a transparent conductor from the synthesized uniform multilayer graphene film, wherein the multilayer graphene film includes a plurality of uniform bilayer graphene films synthesized by chemical vapor deposition and stacked together.

20. The method of claim 1, wherein 70% or more of the multilayer graphene film has the same number of graphene layers.

21. The method of claim 1, wherein the multilayer graphene film has interlayer uniformity.

22. The method of claim 1, wherein the multilayer graphene film has the same number of graphene layers throughout substantially the entire film.

23. The method of claim 1, wherein the multilayer graphene film has at least two dimensions on a macroscale.

24. The method of claim 23, wherein at least one of the dimensions is greater than or equal to about 2 inches.

25. The method of claim 1, comprising the steps of:
(a) placing a substrate having a metal surface in a reaction chamber;
(b) after step (a), increasing the temperature in the reaction chamber from a starting temperature to a deposition temperature and flowing a conditioning gas in the reaction chamber during the step of increasing the temperature;
(c) after step (b), maintaining the deposition temperature in the reaction chamber for a deposition time, flowing a reaction gas in the reaction chamber during the step of maintaining the deposition temperature, and ceasing the flow of the conditioning gas before the step of maintaining the deposition temperature; and
(d) after step (c), reducing the temperature in the reaction chamber at a controlled rate, ceasing the flow of the reaction gas, and flowing an inert gas in the reaction chamber during the step of reducing the temperature,
wherein the conditioning gas is stable up to and including at least the deposition temperature and is suitable to reduce or deoxidize the metal surface without introducing impurities, and
wherein the controlled rate is in a range between 18° C./min and 36° C./min.

26. The method of claim 25, wherein the metal surface is a copper surface.

27. The method of claim 25, further comprising the steps of:
evacuating the reaction chamber after step (a) so that the pressure in the reaction chamber does not exceed 0.5 Torr during any of steps (b)-(d).

28. The method of claim 27, wherein the step of reducing the temperature includes reducing the temperature from the deposition temperature to an intermediate temperature that is greater than the starting temperature, the method further comprising the steps of, after the temperature of the reaction chamber reaches the intermediate temperature:
- increasing the pressure in the reaction chamber;
- increasing the flow rate of the inert gas; and
- continuing to reduce the temperature of the reaction chamber at the controlled rate after increasing the pressure and the flow rate.

\* \* \* \* \*